United States Patent
Rastogi et al.

(10) Patent No.: US 11,711,072 B2
(45) Date of Patent: Jul. 25, 2023

(54) SERIAL BUS REDRIVER WITH TRAILING EDGE BOOST CIRCUIT

(71) Applicant: TEXAS INSTRUMENTS INCORPORATED, Dallas, TX (US)

(72) Inventors: Srijan Rastogi, Bengaluru (IN); Srikanth Manian, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/905,264

(22) Filed: Jun. 18, 2020

(65) Prior Publication Data

US 2021/0119619 A1    Apr. 22, 2021

(30) Foreign Application Priority Data

Oct. 22, 2019   (IN) .............................. 201941042755

(51) Int. Cl.
| | |
|---|---|
| *H03K 5/01* | (2006.01) |
| *H03K 3/037* | (2006.01) |
| *H03K 19/20* | (2006.01) |
| *H03K 5/00* | (2006.01) |

(52) U.S. Cl.
CPC .............. *H03K 5/01* (2013.01); *H03K 3/037* (2013.01); *H03K 19/20* (2013.01); *H03K 2005/00019* (2013.01)

(58) Field of Classification Search
CPC ... H03K 2005/00019; H03K 5/02–086; H03K 5/01; H03K 5/12; H03K 3/037
See application file for complete search history.

(56) References Cited

U.S. PATENT DOCUMENTS

| | | | | |
|---|---|---|---|---|
| 6,237,107 | B1 * | 5/2001 | Williams | G06F 13/4072 713/503 |
| 7,443,211 | B2 * | 10/2008 | Liu | H03K 5/1534 326/30 |
| 7,522,659 | B2 * | 4/2009 | Lacy | G06F 13/4072 326/83 |
| 2014/0207984 | A1 * | 7/2014 | Maung | G06F 13/385 710/105 |
| 2020/0389155 | A1 * | 12/2020 | Gupta | G06F 1/3206 |

* cited by examiner

*Primary Examiner* — Patrick C Chen
(74) *Attorney, Agent, or Firm* — John R. Pessetto; Frank D. Cimino

(57) ABSTRACT

A serial bus re-driver circuit includes an edge detector circuit and a booster circuit. The edge detector circuit is configured to detect a transition of serial bus signal. The booster circuit is coupled to the edge detector circuit, and is configured to switch current to the serial bus signal. The booster circuit includes a leading edge boost pulse generation circuit and a trailing edge boost pulse generation circuit. The leading edge boost pulse generation circuit is configured to switch a first current pulse to the serial bus signal at the transition of the serial bus signal. The trailing edge boost pulse generation circuit is configured to switch a second current pulse to the serial bus signal. The second current pulse is shorter than the first current pulse.

10 Claims, 20 Drawing Sheets

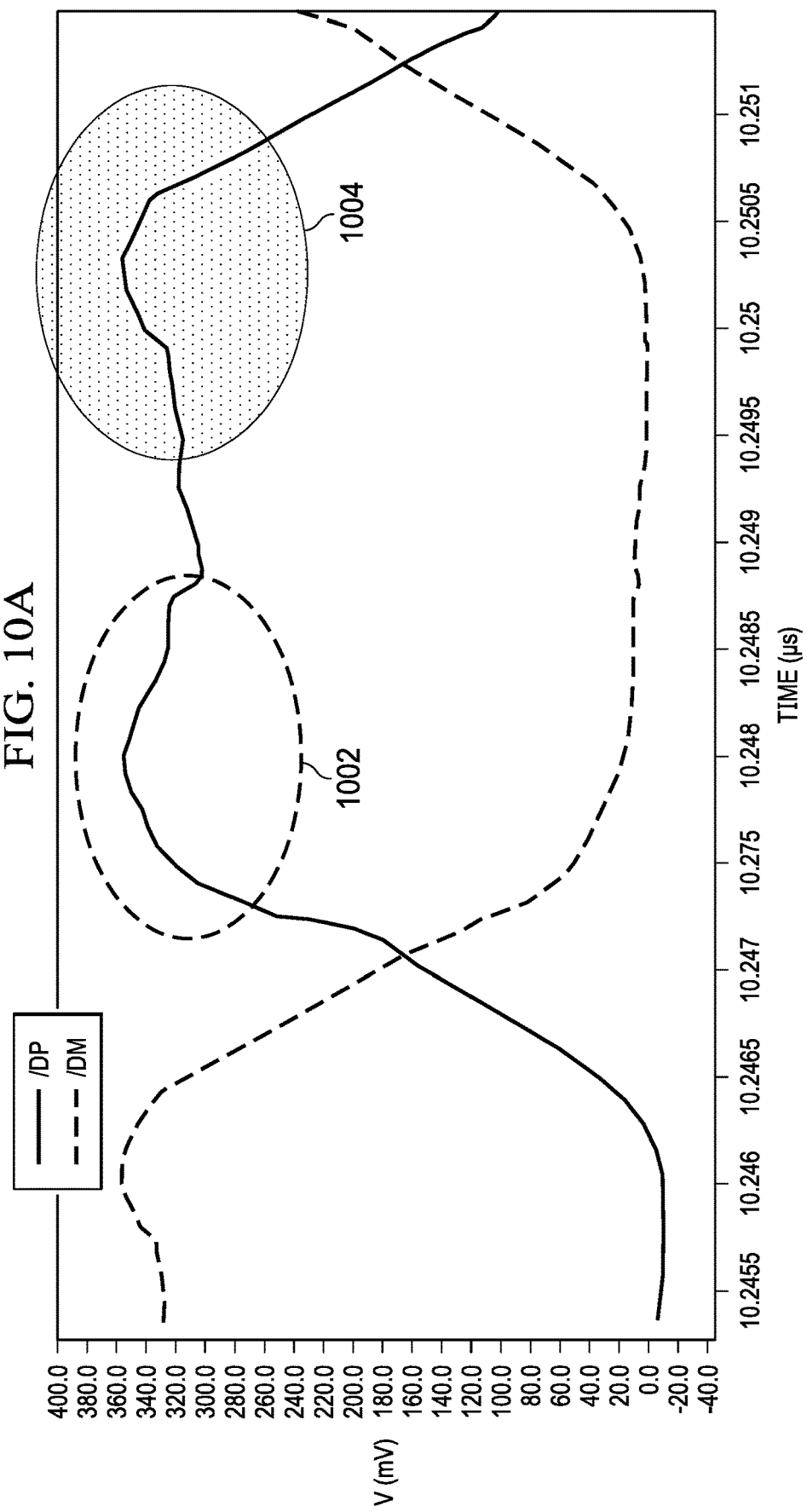

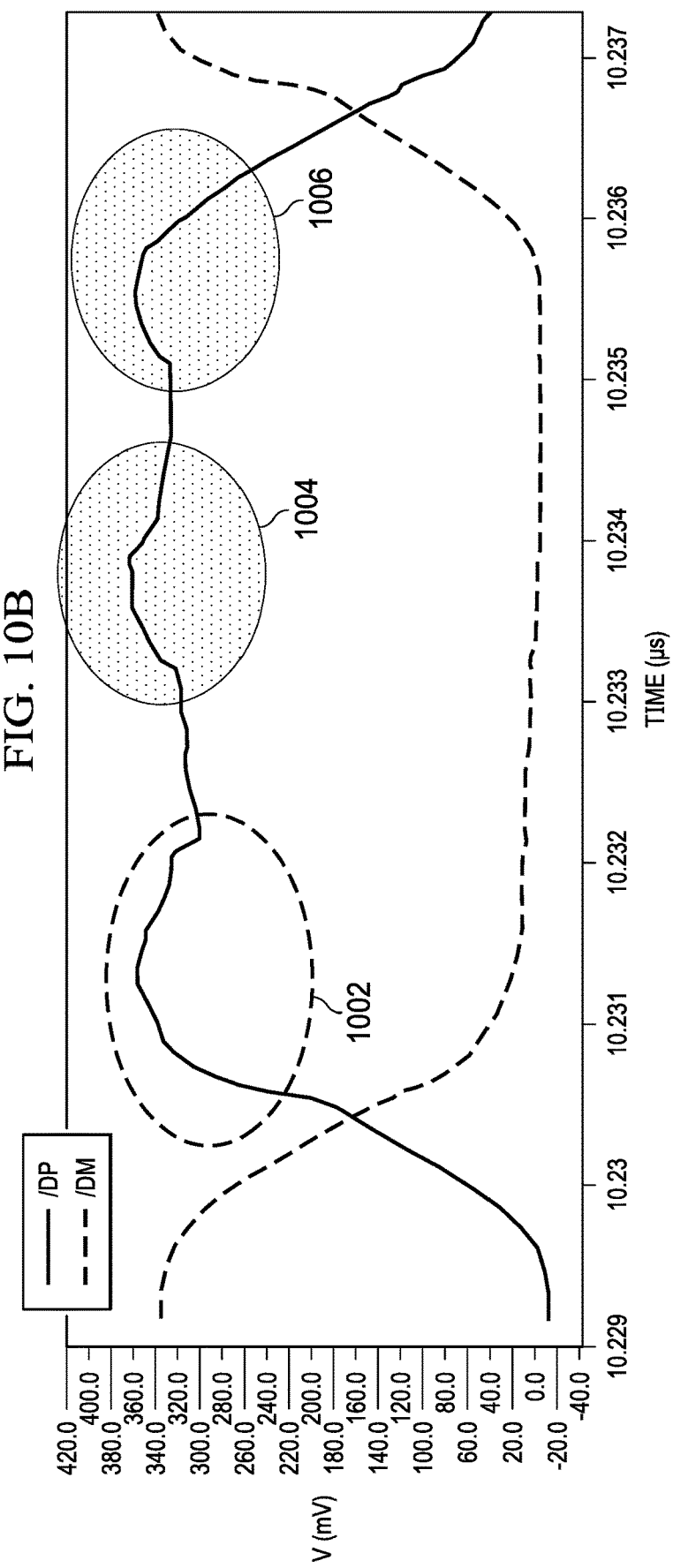

US 11,711,072 B2

SERIAL BUS REDRIVER WITH TRAILING EDGE BOOST CIRCUIT

CROSS-REFERENCE TO RELATED APPLICATIONS

The present application claims priority to Indian Provisional Patent Application No. 201941042755, filed Oct. 22, 2019, entitled "Pre-Cursor Emphasis for USB 2.0 Re-Drivers," which is hereby incorporated herein by reference in its entirety.

BACKGROUND

Serial buses, such as the Universal Serial Bus (USB), are widely used to connect systems of devices. For example, USB is used to connect devices in automotive applications. In such applications, USB data signals may be routed over relatively long lengths of cabling (e.g., >5 meters).

SUMMARY

In one example, a serial bus re-driver circuit includes a serial bus terminal, an edge detector circuit, and a booster circuit. The edge detector circuit includes an input terminal coupled to the serial bus terminal, and an output terminal. The booster circuit is coupled to the edge detector circuit, and includes a leading edge boost pulse generation circuit and a trailing edge boost pulse generation circuit. A leading edge boost pulse generation circuit includes an input terminal coupled to the output terminal of the edge detector circuit, and a leading edge boost pulse output terminal. The trailing edge boost pulse generation circuit is coupled to the leading edge boost generation circuit, and includes a pulse shortening circuit, a pulse gating circuit, and a drive transistor. The pulse shortening circuit is coupled to the leading edge boost pulse output terminal. The pulse gating circuit is coupled to the pulse shortening circuit. The drive transistor is coupled to the pulse gating circuit and the serial bus terminal.

In another example, a serial bus re-driver circuit includes an edge detector circuit and a booster circuit. The edge detector circuit is configured to detect a transition of serial bus signal. The booster circuit is coupled to the edge detector circuit, and is configured to switch current to the serial bus signal. The booster circuit includes a leading edge boost pulse generation circuit and a trailing edge boost pulse generation circuit. The leading edge boost pulse generation circuit is configured to switch a first current pulse to the serial bus signal at the transition of the serial bus signal. The trailing edge boost pulse generation circuit is configured to switch a second current pulse to the serial bus signal. The second current pulse is shorter than the first current pulse.

In a further example, a method includes detecting a leading edge of a serial bus signal in a first unit interval. A leading edge boost signal is generated responsive to detecting the transition. A first current pulse to a serial bus is initiated at the transition responsive to the leading edge boost signal. The first current pulse is terminated prior to expiration of the first unit interval. A trailing edge boost signal is generated, in a second unit interval, based on the leading edge boost signal. A second current pulse to the serial bus is initiated, in the second unit interval, responsive to the trailing edge boost signal. The second current pulse is terminated prior to expiration of the second unit interval.

BRIEF DESCRIPTION OF THE DRAWINGS

For a detailed description of various examples, reference will now be made to the accompanying drawings in which:

FIGS. 10A-10C show application of trailing edge boost in 2, 3, and 4 unit interval (UI) serial bus signals;

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Figure 1:
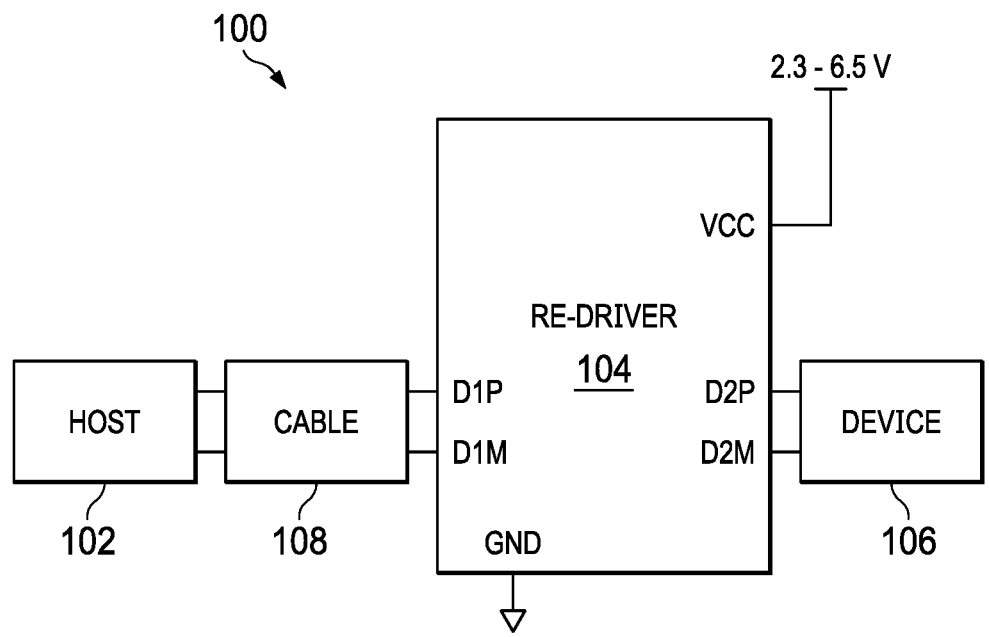
FIG. 1 shows a block diagram for an example serial bus system that includes a re-driver circuit.

FIG. 1 shows a block diagram for an example serial bus system 100. The serial bus system 100 includes a host 102, re-driver circuit 104, a device 106, and a cable 108. The host 102 and the device 106 communicate via the re-driver circuit 104 and the cable 108. The serial bus system 100 is a USB 2.0 system in some implementations, the host 102 is a universal serial bus (USB) 2.0 host, the device 106 is a USB 2.0 device, and the re-driver circuit 104 is a USB 2.0 re-driver circuit. The re-driver circuit 104 detects serial bus signals on the cable 108 and sources/sinks current to/from the cable 108 to improve the characteristics of the serial bus signal.

In some applications, e.g., automotive applications, the cable 108 may be relatively long (e.g., 5 meters or more). The re-driver circuit 104 boosts the edges and level of the serial bus signal to meet the near-end eye specifications of USB 2.0.

Figure 2:
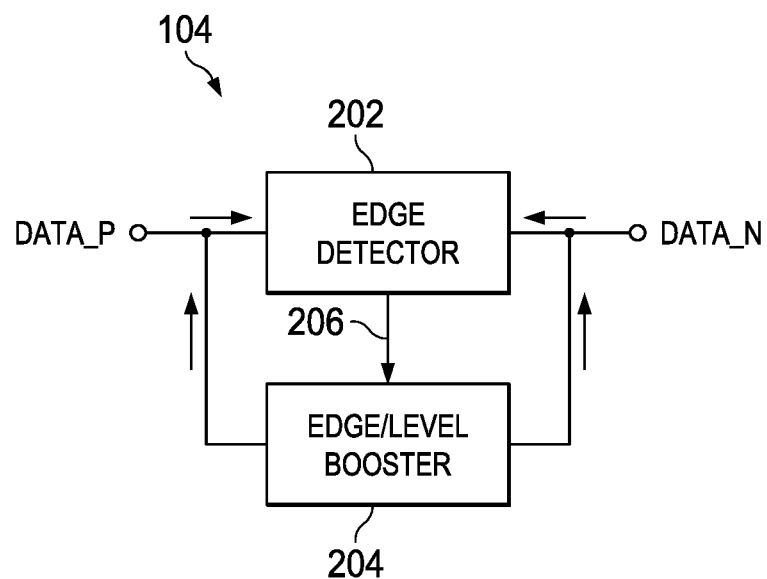
FIG. 2 shows a block diagram for an example re-driver circuit that includes edge and level boost.
Figure 3:
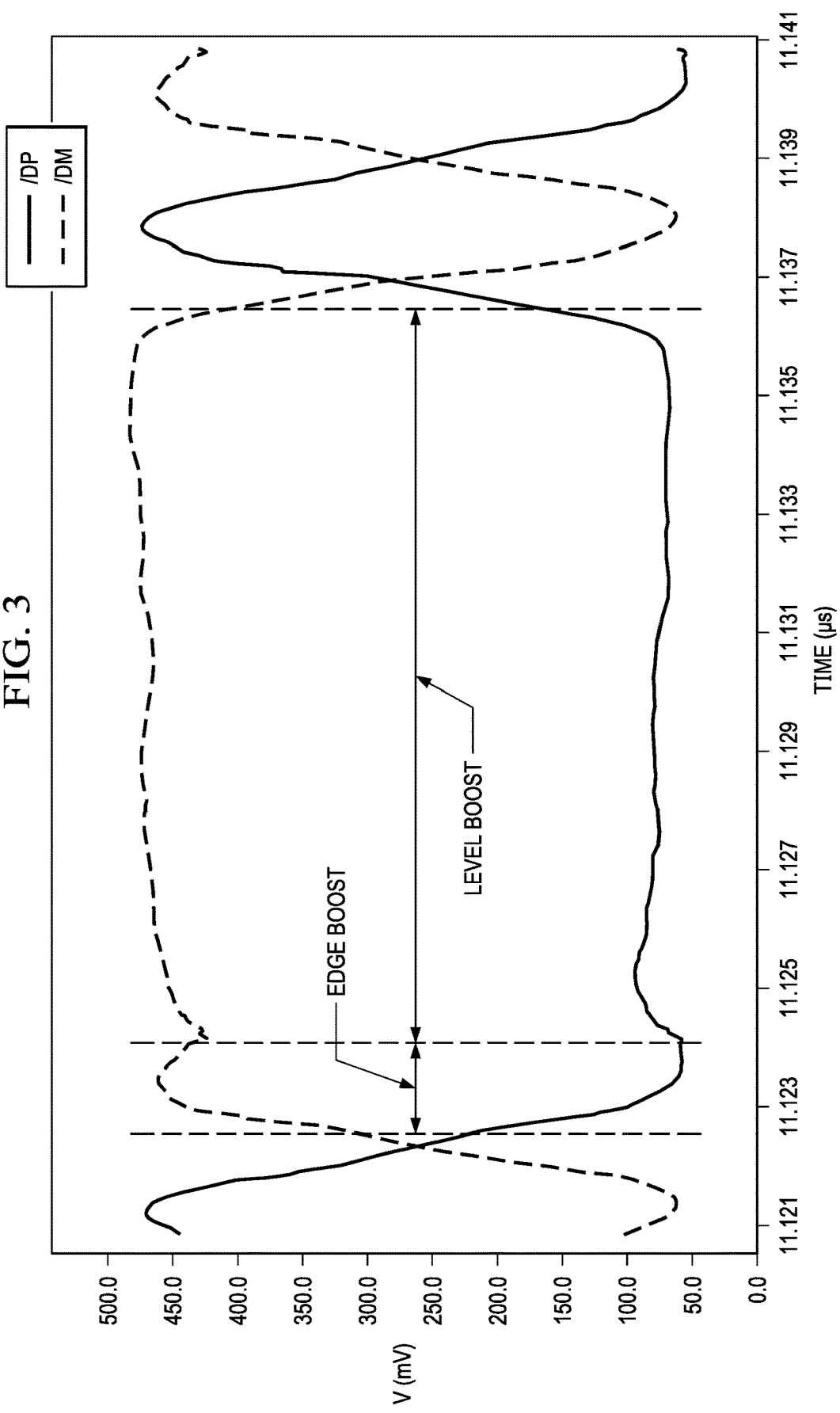
FIG. 3 shows an example serial bus signal with edge boost and level boost.

FIG. 2 shows a block diagram for an example re-driver circuit 104. The re-driver circuit 104 includes an edge detector circuit 202 and an edge/level booster circuit 204. The edge detector circuit 202 includes a fast differential comparator that detects the start of a transition (an edge) of the signal (serial bus signal) on the cable 108. On detection of a transition of the serial bus signal, the edge detector circuit 202 generates an edge notification signal 206. The edge/level booster circuit 204 receives the edge notification signal 206 and switches a current pulse (an edge boost pulse) to the serial bus to increase the edge rate of the serial bus signal. In some implementations of the edge detector circuit 202, the edge boost pulse has a duration of about 0.7 unit interval (UI) (1.4 nanoseconds (ns) for a 2 ns UI at 240 megahertz (MHz). At termination of the edge boost pulse, the edge/level booster circuit 204 switches level boost current to the serial bus. FIG. 3 shows an example serial bus signal with edge boost and level boost applied by an implementation of the re-driver circuit 104. The level boost is turned off when the edge detector circuit 202 detects the falling edge of the differential signal, i.e., the differential signal voltage falls below a threshold. If the level boost current is relatively high (e.g., above about 1.5 milli-amperes), the differential voltage of the serial bus signal increases to a level (525 milli-volts or more) that causes the host 102 to mistakenly detect disconnection of the device 106 from the serial bus as per the USB 2.0 protocol.

Figure 4:
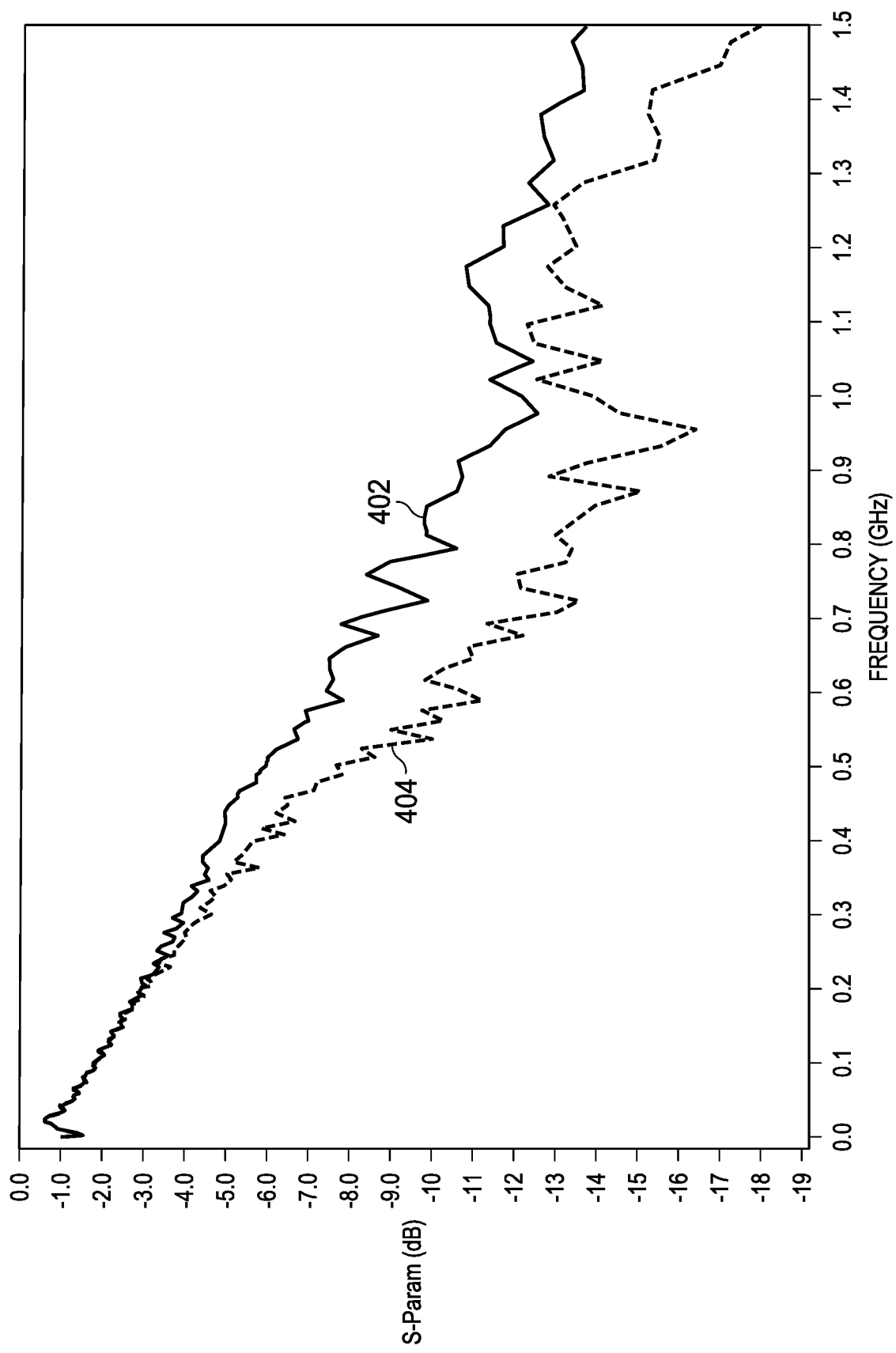
FIG. 4 shows channel response of a serial bus system with a five meter cable with and without parasitic capacitance.

FIG. 4 shows channel response (at the host 102) of a serial bus system with a 5 meter cable with and without parasitic capacitance. Response curve 402 shows channel response with no parasitic capacitance. Response curve 404 shows channel response with 5 pico-farads of parasitic capacitance. At 240 MHz, AC loss in the 5 meter cable 108 is about −4 decibels (dB). If the DC loss of the cable 108 is about −1 dB (as per FIG. 4), and the loss profile is as shown in FIG. 4, then the minimum level boost current needed to meet the USB 2.0 near end specification is about 1.7 milliamperes (ma).

Figure 5A:
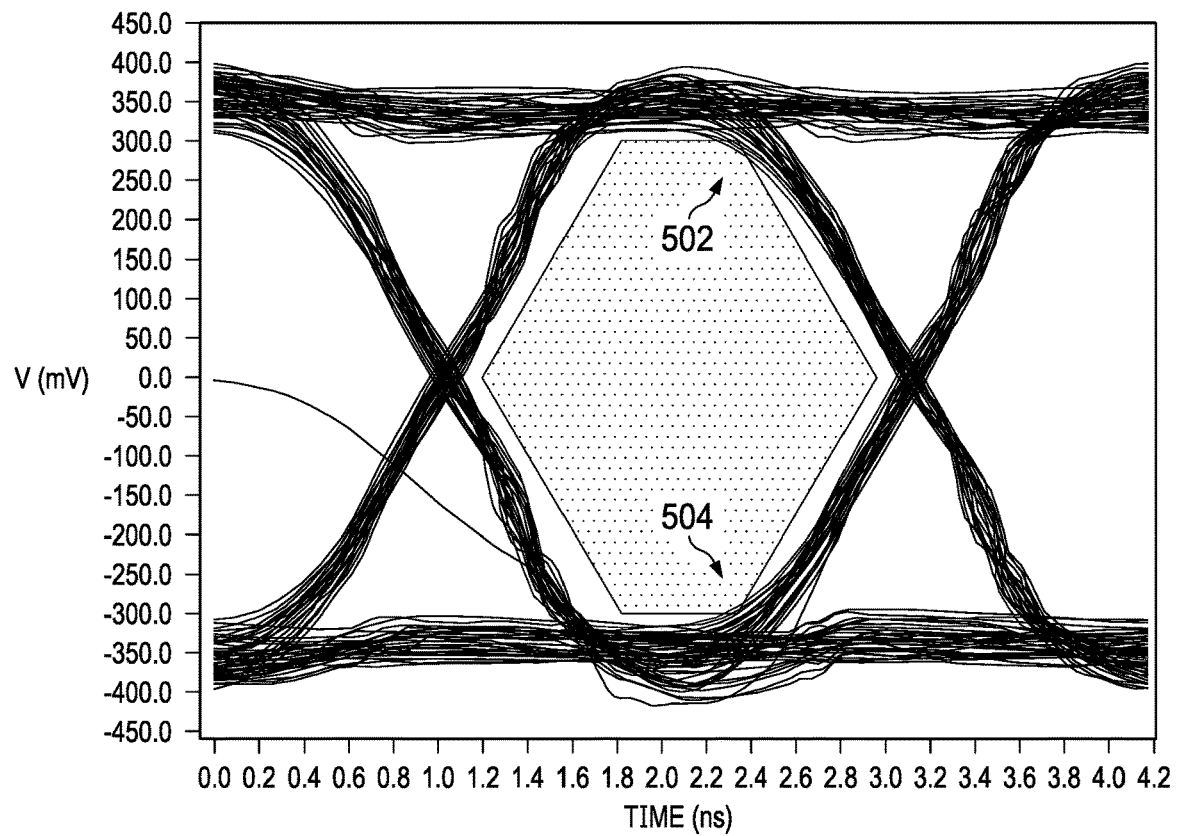
FIGS. 5A and 5B show an eye diagram in a serial bus system with a re-driver circuit lacking level boost.
Figure 5B:
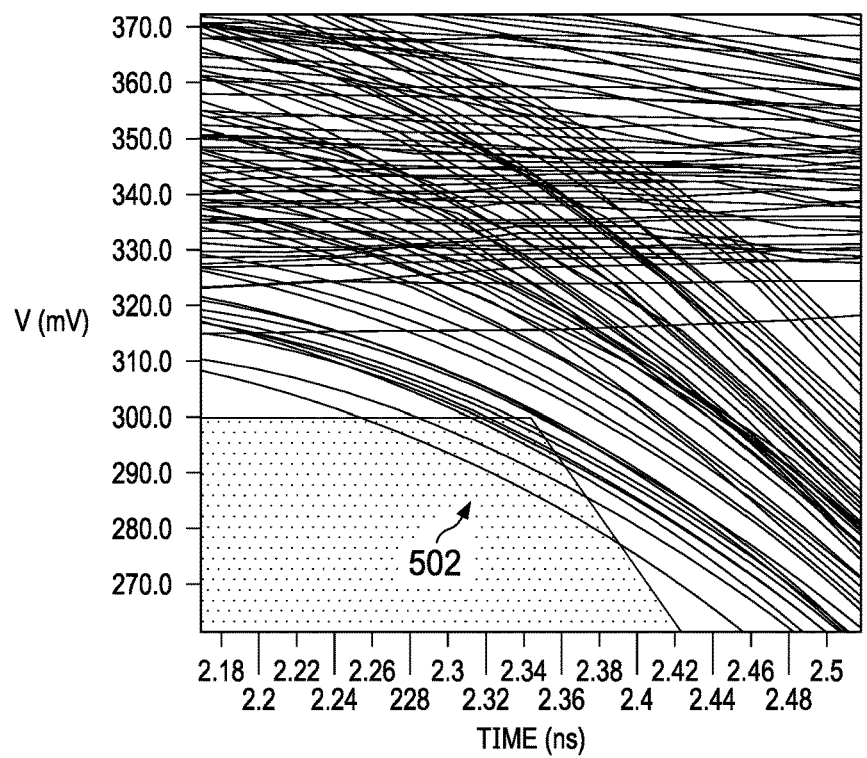

FIG. 5A shows an example eye diagram for a serial bus signal with no level boost current applied. Without level boost, the eye diagram fails to meet the USB 2.0 specifications at corners 502 and 504. FIG. 5B shows a magnified view of the corner 502 of the eye diagram.

Figure 6:
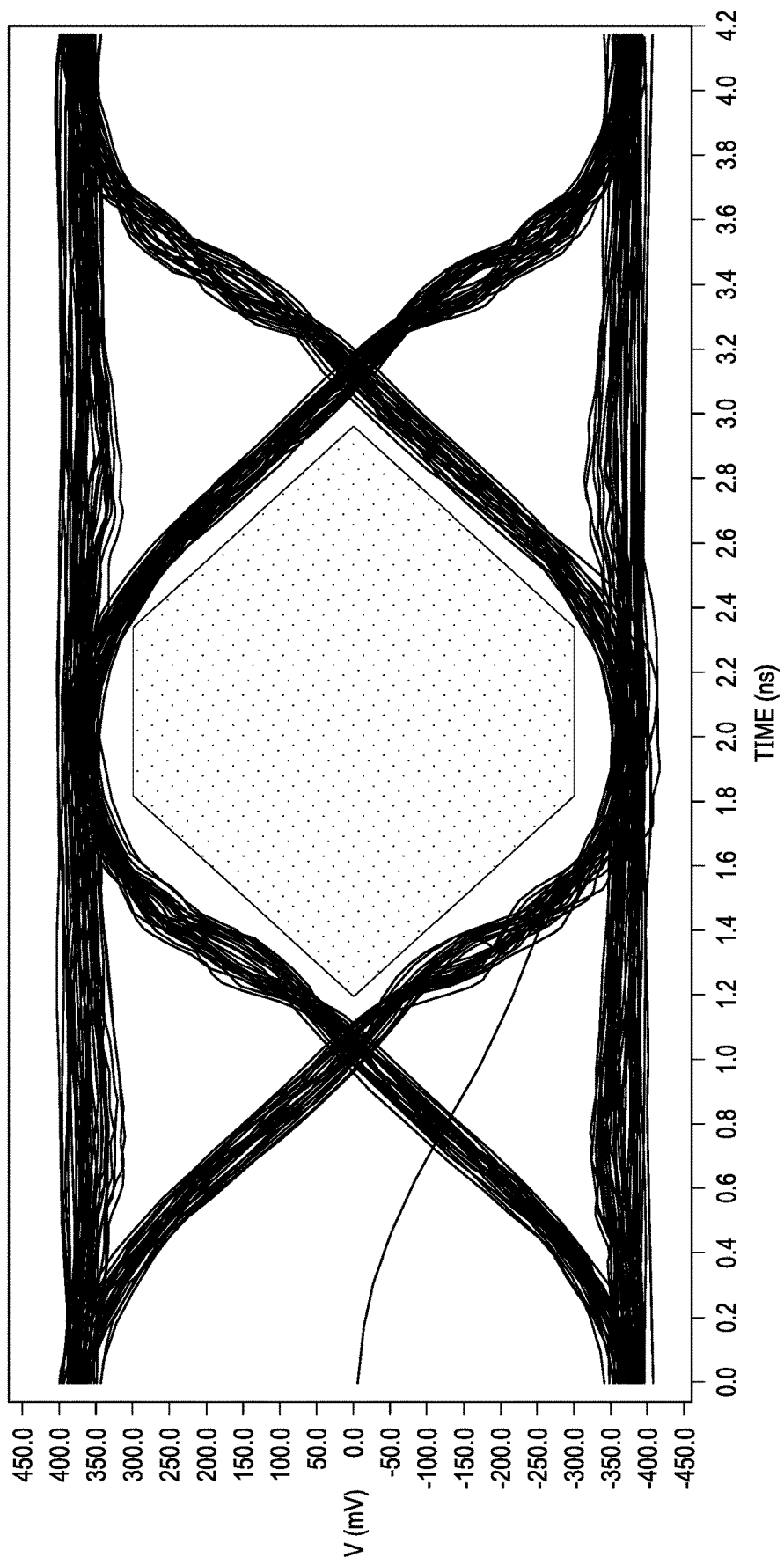
FIG. 6 shows an eye diagram in a serial bus system with a re-driver circuit that includes level boost.
Figure 7:
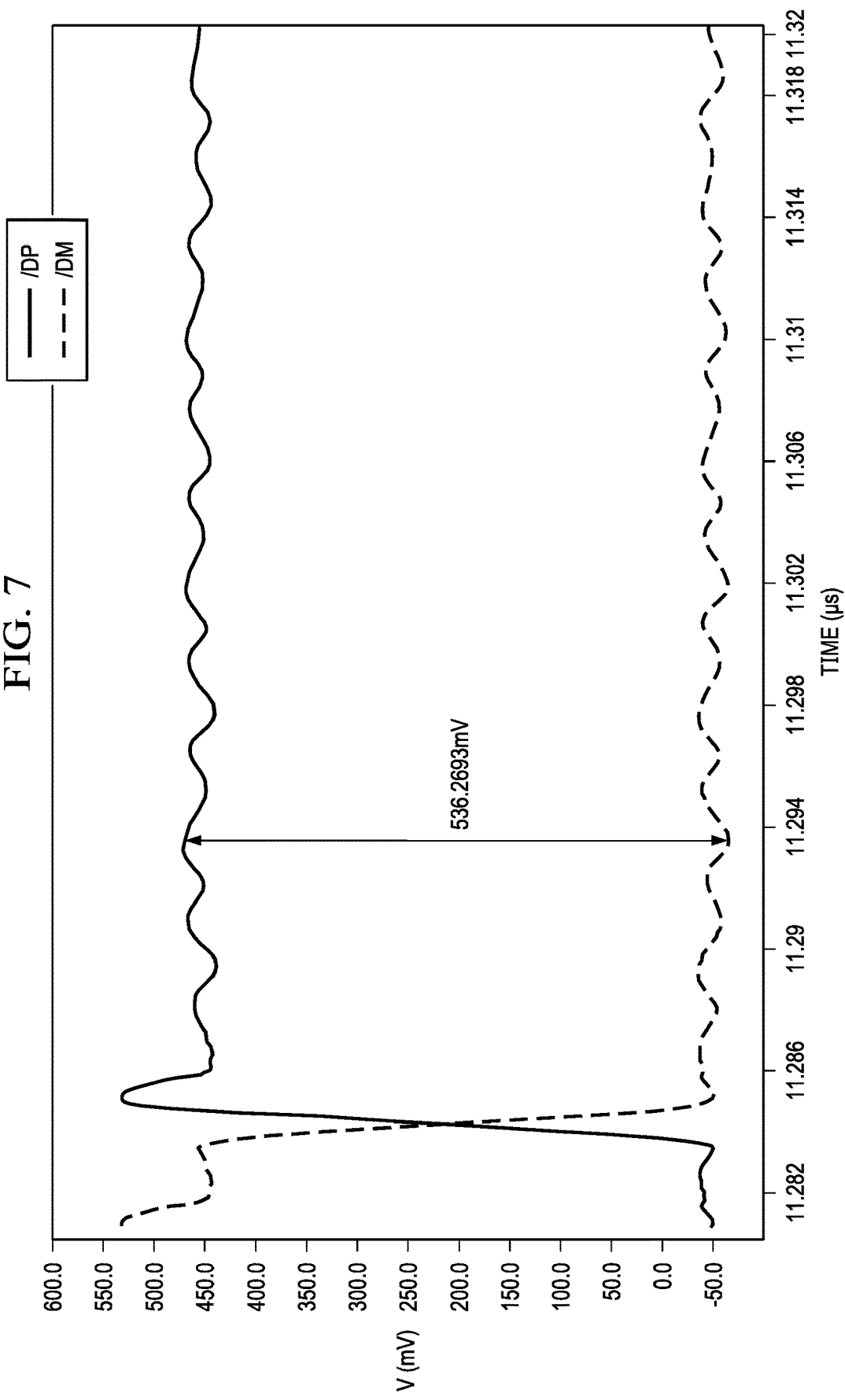
FIG. 7 shows differential swing in a serial bus system with a re-driver circuit that includes level boost.

FIG. 6 shows an eye diagram for a serial signal with 1.7 ma of level boost current applied by an implementation of the re-driver circuit 104. With the level boost current the eye is compliant with the USB 2.0 specification. However, with 1.7 ma of level boost current, the differential voltage of the serial bus signal is high enough (>=525 my) to trigger false disconnect when the re-driver circuit 104 is disposed near the host 102. On detection of disconnect, the host 102 disables its transmitter, and communication is disrupted. FIG. 7 shows the differential swing on a serial bus signal with 1.7 ma of level boost current. In FIG. 7, the differential voltage is about 535 mv, which is high enough to trigger false disconnect.

Figure 8:
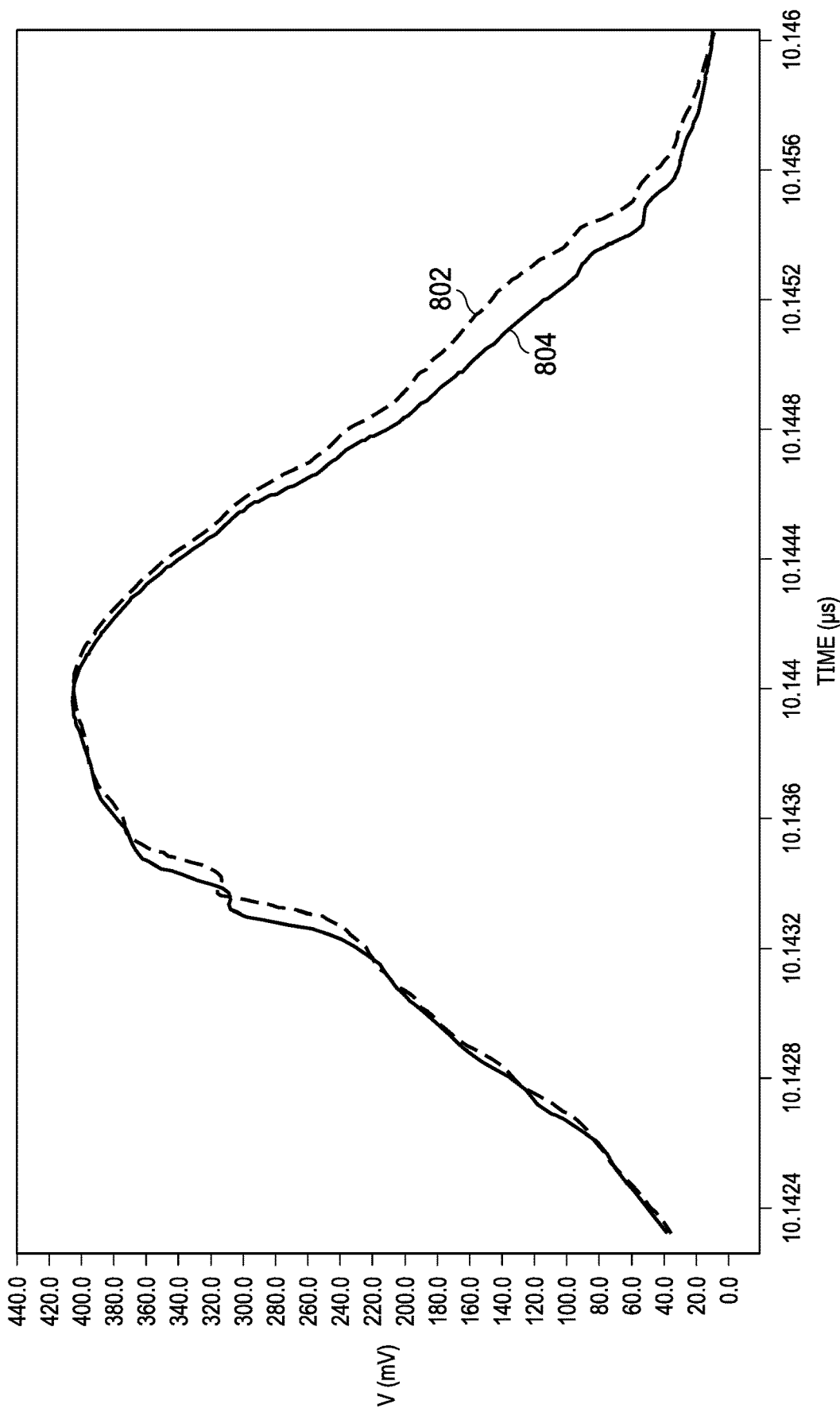
FIG. 8 shows rise and fall of a serial bus signal with re-driver circuits with and without level boost.

The edge/level booster circuit 204 turns off level boost current when the edge detector circuit 202 detects differential voltage below a predetermined threshold. Thus, level boost current is applied during a portion of the serial bus signal falling edge, which increases fall time. FIG. 8 shows rise and fall of a serial bus signal with re-driver circuits with and without level boost. In FIG. 8, level boost current is applied to the signal 802, and no level boost current is applied to the signal 804. Additionally, with an edge pulse width of 1.4 ns, for a single UI (2 ns) the serial bus signal is already falling when the edge/level booster circuit 204 starts injecting level boost current. Thus, level boost current significantly degrades fall time of a single UI pulse.

Level boost current also increases jitter in some implementations. With level boost current of 1.7 ma and fast (−500 pico-seconds (ps)) rise/fall transitions, the threshold for disabling level boost current is about 300 mv. The differential signal will cross at about 200 my (for a 400 mv signal swing) and level boost current is injected at the signal crossover point, which increases jitter.

The re-driver circuits disclosed herein apply trailing edge boost to implement pre-cursor emphasis that reduces or eliminates the need for high level boost current, and the issues caused by high level boost current (false disconnect, high jitter, degraded fall time). The re-driver circuits apply trailing edge boost to 2 UI, 3 UI, or longer pulses such that the USB 2.0 eye specifications are met and the shortcomings of high level boost current are avoided. For example, jitter is reduced and falling edge times are improved.

Figure 9:
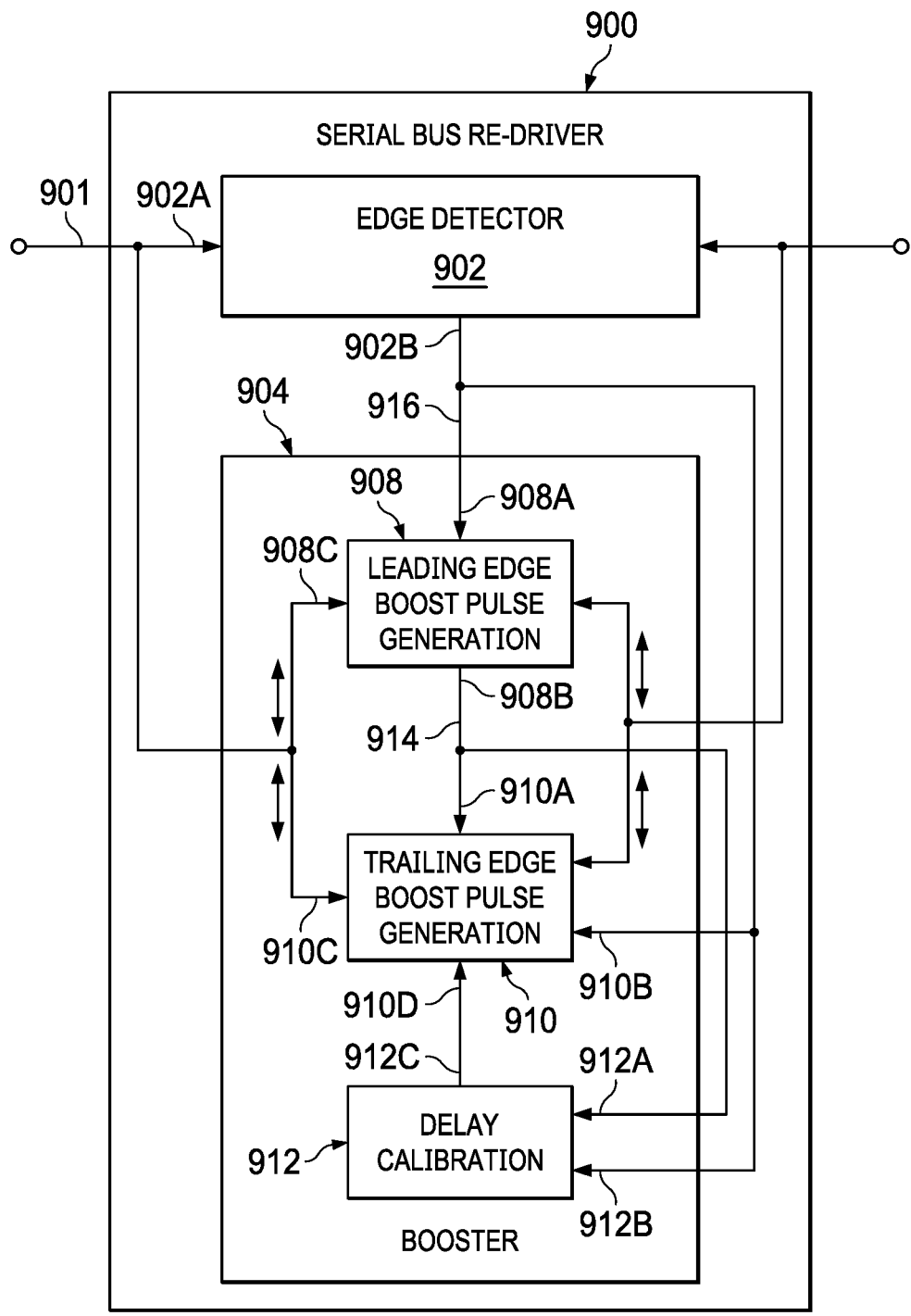
FIG. 9 shows a block diagram for a serial bus re-driver circuit that includes trailing edge boost.

FIG. 9 shows a block diagram for an example serial bus re-driver circuit 900. The serial bus re-driver circuit 900 includes a serial bus terminal 901, an edge detector circuit 902 and a booster circuit 904. The serial bus terminal 901 is coupled to the cable 108. The edge detector circuit 902 includes one or more comparators that detect transitions (edges) of the signal (serial bus signal) on the cable 108 (e.g., at the serial bus terminal 901). The edge detector circuit 902 includes an input terminal 902A coupled to the serial bus terminal 901 and an output terminal 902B.

The booster circuit 904 is coupled to the edge detector circuit 902. The booster circuit 904 includes a leading edge boost pulse generation circuit 908, a trailing edge pulse generation circuit 910, and a delay calibration circuit 912. The leading edge boost pulse generation circuit 908 generates a current pulse at a leading edge of the serial bus signal as detected by the edge detector circuit 902. The leading edge boost pulse generation circuit 908 applies the current pulse to the serial bus signal detected on the cable 108. The leading edge boost pulse generation circuit 908 includes an input terminal 908A coupled to the output terminal 902B of the edge detector circuit 902 for reception of a signal 906 indicating detection of a transition (e.g., leading edge) on the serial bus signal. The leading edge boost pulse generation circuit 908 also includes a leading edge boost pulse output terminal 908B and a current pulse output terminal 908C. The current pulse output terminal 908C is coupled to the serial bus terminal 901 for driving a current pulse onto the cable 108.

The trailing edge pulse generation circuit 910 is coupled to the leading edge boost pulse generation circuit 908 and the edge detector circuit 902. The trailing edge pulse generation circuit 910 generates a current pulse at a trailing edge of the serial bus signal detected by the edge detector circuit 902. The trailing edge pulse generation circuit 910 applies the current pulse to the serial bus signal detected on the cable 108. The trailing edge pulse generation circuit 910 generates a first current pulse in a second UI of a 2 UI serial bus signal, generates a first current pulse in a second UI and a second current pulse in a third UI of a 3 UI serial bus signal, etc. The trailing edge pulse generation circuit 910 includes an input terminal 910A coupled to the leading edge boost pulse output terminal 908B of the 908 leading edge boost pulse generation circuit 908, and an input terminal 910B coupled to the output terminal 902B of the edge detector circuit 902. The trailing edge pulse generation circuit 910 includes an output terminal 910C coupled to the serial bus terminal 901 for driving a current pulse onto the cable 108.

Figure 10C:
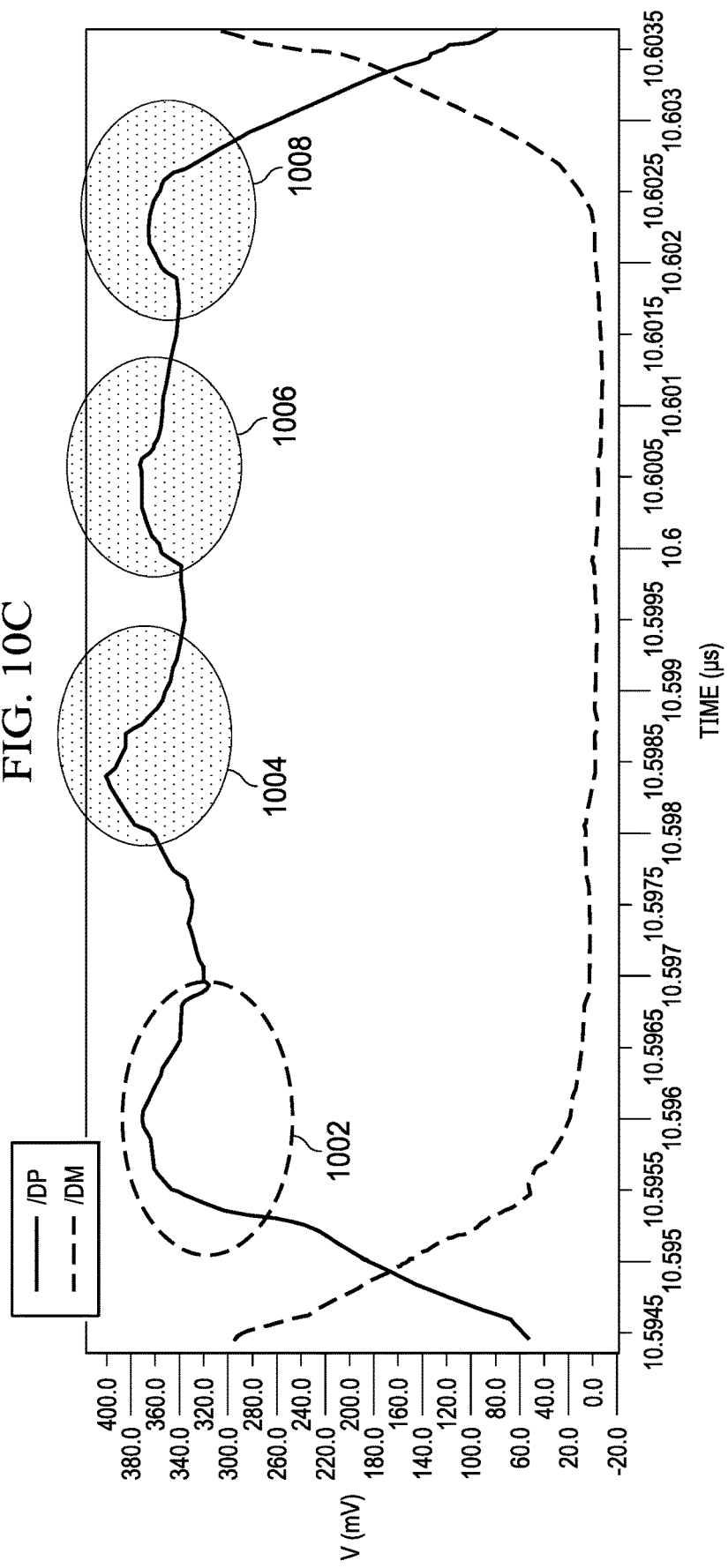

FIGS. 10A-10C show serial bus signals with trailing edge pulses applied. FIG. 10A shows a 2 UI serial bus signal with a leading edge current pulse generated by the leading edge boost pulse generation circuit 908 applied at a leading edge 1002 of the serial bus signal and a trailing edge current pulse generated by the trailing edge pulse generation circuit 910 applied at an end 1004 of the second UI. FIG. 10B shows a 3 UI serial bus signal with a leading edge current pulse generated by the leading edge boost pulse generation circuit 908 applied at a leading edge 1002 of the serial bus signal, a first trailing edge current pulse generated by the trailing edge pulse generation circuit 910 applied at end 1004 of the second UI, and a second trailing edge current pulse generated by the trailing edge pulse generation circuit 910 applied at end 1006 of the second UI. FIG. 10C shows a 4 UI serial bus signal with a leading edge current pulse generated by the leading edge boost pulse generation circuit 908 applied at a leading edge 1002 of the serial bus signal, a first trailing edge current pulse generated by the trailing edge pulse generation circuit 910 applied at end 1004 of the second UI, a second trailing edge current pulse generated by the trailing edge pulse generation circuit 910 applied at end 1006 of the second UI, and a third trailing edge current pulse generated by the trailing edge pulse generation circuit 910 applied at end 1008 of the third UI.

Returning now to the serial bus re-driver circuit 900, the delay calibration circuit 912 is coupled to the trailing edge pulse generation circuit 910. The delay calibration circuit 912 is coupled to the trailing edge pulse generation circuit 910, the leading edge boost pulse generation circuit 908, and the edge detector circuit 902. The delay calibration circuit 912 adjusts the delay applied in delay cells of the trailing edge pulse generation circuit 910 based on timing of a series of synchronization (sync) pulses included in the serial bus signal. Calibration of the delays compensates for variation in delay of the delay cells due to process, voltage, and temperature. The delay calibration circuit 912 includes an output terminal 912C coupled to an input terminal 910D of the trailing edge pulse generation circuit 910 for transfer of delay trim control to the delay cells of the trailing edge pulse generation circuit 910.

Figure 11:
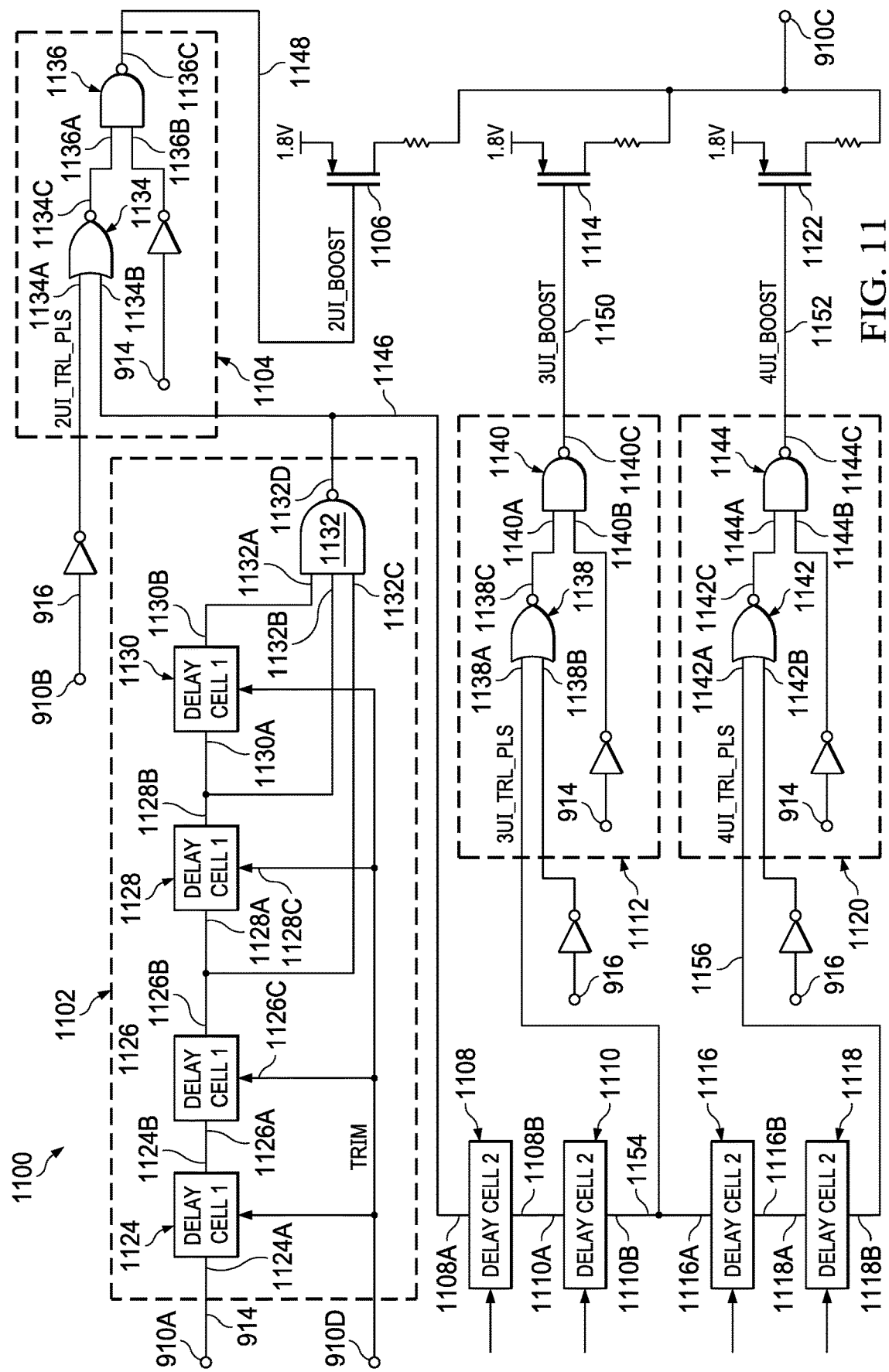
FIG. 11 shows a schematic level diagram for a trailing edge boost circuit.

FIG. 11 shows a schematic level diagram for a trailing edge boost circuit 1100. The trailing edge boost circuit 1100 is an implementation of the trailing edge pulse generation circuit 910. The trailing edge boost circuit 1100 includes a pulse shortening circuit 1102, a pulse gating circuit 1104, and a drive transistor 1106 that generates a trailing edge current pulse at end 1004 of the second UI. The trailing edge boost circuit 1100 also includes delay cells 1108 and 1110, a pulse gating circuit 1112, and a drive transistor 1114 that generates a trailing edge current pulse at end 1006 of a third UI. The trailing edge boost circuit 1100 further includes delay cells 1116 and 1118, a pulse gating circuit 1120, and a that generates a trailing edge current pulse at end 1008 of a fourth UI.

The pulse shortening circuit 1102 includes a delay cell 1124, a delay cell 1126, a delay cell 1128, and a delay cell 1130 coupled in series to delay the leading edge boost pulse signal 914 provided at the leading edge boost pulse output terminal 908B of the leading edge boost pulse generation circuit 908. The delay cell 1124 includes an input terminal 1124A coupled to the input terminal 910A and the leading edge boost pulse output terminal 908B, and an output terminal 1124B coupled to an input terminal 1126A of the delay cell 1126. An output terminal 1126B of the delay cell 1126 is coupled an input terminal 1128A of the delay cell 1128. An output terminal 1128B of the delay cell 1128 is coupled to an input terminal 1130A of the delay cell 1130.

The pulse shortening circuit 1102 also includes a conjunctive logic circuit 1132 (e.g., a NAND gate) that combines the output signals of the delay cells 1126-1130 to generate a trailing edge pulse signal 1146 that is a shortened and delayed version of the leading edge boost pulse signal 914. For example, a leading edge of the trailing edge pulse signal 1146 is delayed by 1.5 UI or more relative to a leading edge of the leading edge boost pulse signal 914, and the trailing edge pulse signal 1146 is 0.5 UI or less in duration. The conjunctive logic circuit 1132 includes an input terminal 1132A coupled to an output terminal 1130B of the delay cell 1130, an input terminal 1132B coupled to an output terminal 1128B of the delay cell 1128, and an input terminal 1132C coupled to an output terminal 1126B of the delay cell 1126.

The pulse gating circuit 1104 gates the trailing edge pulse signal 1146 to allow generation of a trailing edge current pulse during the second UI of a multi-UI serial bus signal. The pulse gating circuit 1104 includes a logic gate 1134 and a logic gate 1136. The logic gate 1134 gates the trailing edge pulse signal 1146 with a comparator output signal 916 provided by the edge detector circuit 902. The comparator output signal 916 indicates that the differential voltage of the serial bus exceeds a threshold. The logic gate 1134 includes an input terminal 1134A coupled to the input terminal 9106 and the output terminal 902B of the edge detector circuit 902, and an input terminal 1134B coupled to an output terminal 1132D of the conjunctive logic circuit 1132. The logic gate 1134 is a NOR gate in some implementations of the pulse gating circuit 1104. The logic gate 1136 gates the output of the logic gate 1134 with the leading edge boost pulse signal 914 to ensure that the trailing edge boost circuit 1100 does not generate a trailing edge current pulse in the first UI. The logic gate 1136 includes an input terminal 1136A coupled to the output terminal 1134C of the logic gate 1134, an input terminal 1136B coupled to the to the input terminal 910A and the leading edge boost pulse output terminal 908B of the leading edge boost pulse generation circuit 908. The logic gate 1136 is a NAND gate in some implementations of the pulse gating circuit 1104.

The drive transistor 1106 switches current to the cable 108 under control of output of the pulse gating circuit 1104. The drive transistor 1106 is P-channel metal oxide semiconductor field effect transistor (MOSFET) in some implementations of the trailing edge boost circuit 1100. A gate terminal of the drive transistor 1106 is coupled to an output terminal 1136C of the logic gate 1136, a source terminal of the drive transistor 1106 is coupled to a power supply terminal, and a drain terminal of the drive transistor 1106 is coupled to the output terminal 910C and the serial bus terminal 901 to pass a current to the cable 108.

The delay cells 1108 and 1110 delay the trailing edge pulse signal 1146 by a UI to generate a trailing edge pulse signal in the third UI. The pulse gating circuit 1112 gates the output of the delay cell 1110 to allow generation of a trailing edge current pulse during the third UI of a multi-UI serial bus signal. The delay cell 1108 includes an input terminal 1108A coupled to the output terminal 1132D of the conjunctive logic circuit 1132. The delay cell 1110 includes an input terminal 1110A coupled to an output terminal 1108B of the delay cell 1108. The pulse gating circuit 1112 is similar to the pulse gating circuit 1104. The pulse gating circuit 1112 includes a logic gate 1138 and a logic gate 1140. The logic gate 1138 gates the trailing edge pulse signal 1146 with the comparator output signal 916 provided by the edge detector circuit 902. The logic gate 1138 includes an input terminal 1138A coupled to the output terminal 902B of the edge detector circuit 902, and an input terminal 1138B coupled to an output terminal 11106 of the delay cell 1110. The logic gate 1138 is a NOR gate in some implementations of the pulse gating circuit 1112.

The logic gate 1140 gates the output of the logic gate 1138 with the leading edge boost pulse signal 914 to ensure that the trailing edge boost circuit 1100 does not generate a trailing edge current pulse in the first UI. The logic gate 1140 includes an input terminal 1140A coupled to the output terminal 1138C of the logic gate 1138, an input terminal 1140B coupled to the to the input terminal 910A and the leading edge boost pulse output terminal 908B of the leading edge boost pulse generation circuit 908. The logic gate 1140 is a NAND gate in some implementations of the pulse gating circuit 1112. The drive transistor 1114 switches current to the cable 108 under control of output of the pulse gating circuit 1112. The drive transistor 1114 is P-channel MOSFET in some implementations of the trailing edge boost circuit 1100. A gate terminal of the drive transistor 1114 is coupled to an output terminal 1140C of the logic gate 1140, a source terminal of the drive transistor 1114 is coupled to a power supply terminal, and a drain terminal of the drive transistor 1114 is coupled to the serial bus terminal 901 to pass a current to the cable 108.

The delay cells 1116 and 1118 delay the output of the delay cell 1110 by a UI to generate a trailing edge pulse signal in the fourth UI. The pulse gating circuit 1120 gates the output of the delay cell 1118 to allow generation of a trailing edge current pulse during the fourth UI of a multi-UI serial bus signal. The delay cell 1116 includes an input terminal 1116A coupled to the output terminal 11106 of the delay cell 1110. The delay cell 1118 includes an input terminal 1118A coupled to an output terminal 1116B of the delay cell 1116. The pulse gating circuit 1120 is similar to the pulse gating circuit 1104. The pulse gating circuit 1120 includes a logic gate 1142 and a logic gate 1144. The logic gate 1142 gates the output of the delay cell 1110 with the comparator output signal 916 provided by the edge detector circuit 902. The logic gate 1142 includes an input terminal 1142A coupled to the output terminal 902B of the edge detector circuit 902, and an input terminal 1142B coupled to an output terminal 1118B of the delay cell 1118. The logic gate 1142 is a NOR gate in some implementations of the pulse gating circuit 1120.

The logic gate 1144 gates the output of the logic gate 1142 with the leading edge boost pulse signal 914 to ensure that the trailing edge boost circuit 1100 does not generate a trailing edge current pulse in the first UI. The logic gate 1144 includes an input terminal 1144A coupled to the output terminal 1142C of the logic gate 1142, an input terminal 1144B coupled to the to the input terminal 910A and the leading edge boost pulse output terminal 908B of the leading edge boost pulse generation circuit 908. The logic gate 1144 is a NAND gate in some implementations of the pulse gating circuit 1120. The drive transistor 1122 switches current to the cable 108 under control of output of the pulse gating circuit 1120. The drive transistor 1122 is P-channel MOS-FET in some implementations of the trailing edge boost circuit 1100. A gate terminal of the drive transistor 1122 is coupled to an output terminal 1144C of the logic gate 1144, a source terminal of the drive transistor 1122 is coupled to a power supply terminal, and a drain terminal of the drive transistor 1122 is coupled to the serial bus terminal 901 to pass a current to the cable 108. Although the trailing edge boost circuit 1100 depicted in FIG. 11 provides boost for up to 4 UIs, implementations of the trailing edge boost circuit 1100 can be extended to any number of UIs depending on the cable loss profile.

Figure 12:
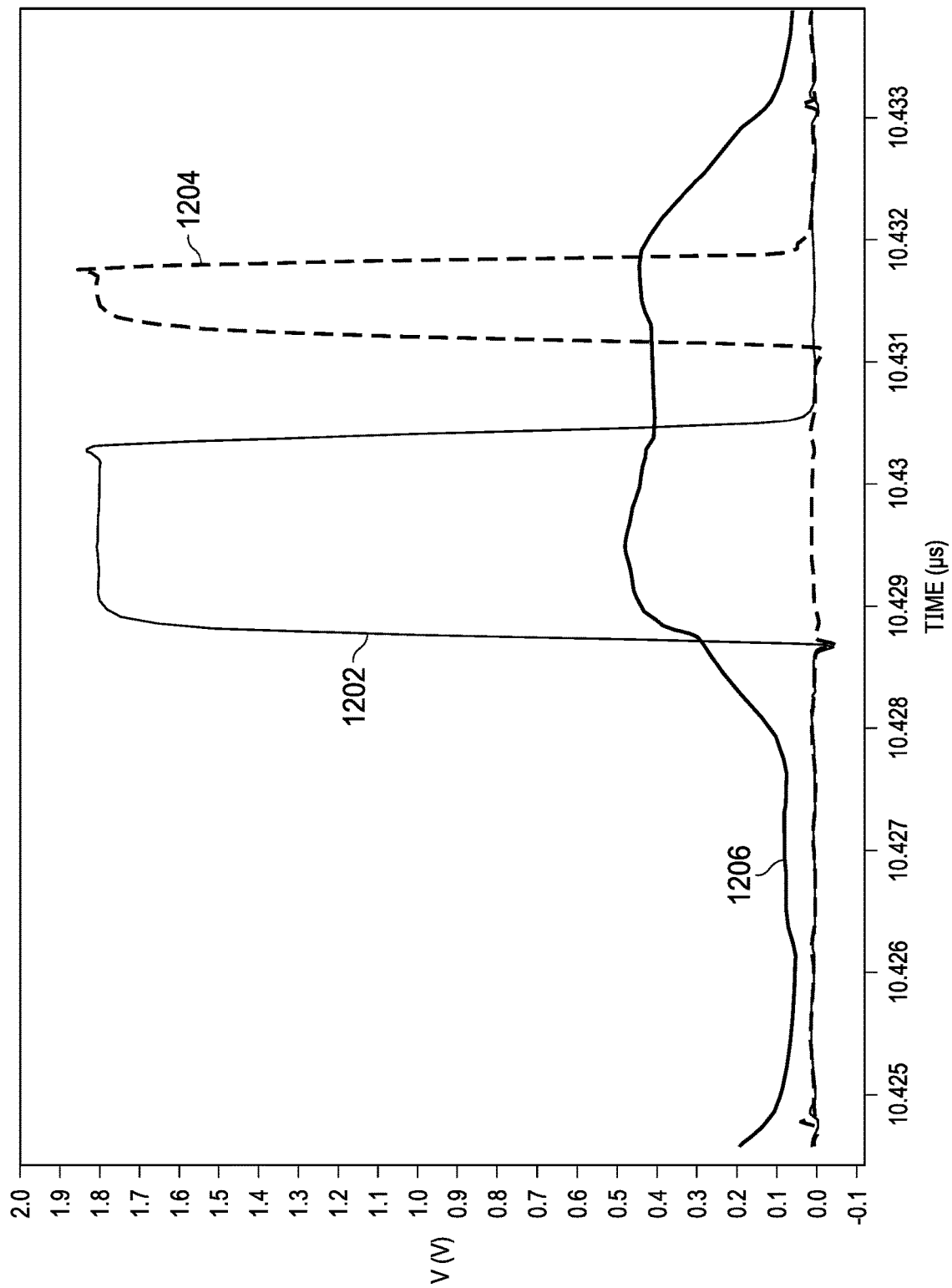
FIG. 12 shows application of trailing edge boost in a 2 UI serial bus signal.

FIG. 12 shows application of trailing edge boost in a two UI pulse of a serial bus signal. A leading edge current pulse 1202 is generated by the leading edge boost pulse generation circuit 908 based on the leading edge boost pulse signal 914, and a trailing edge current pulse 1204 is generated by the trailing edge pulse generation circuit 910 based on the trailing edge pulse signal 1146. The leading edge current pulse 1202 is initiated at the leading edge of the serial bus signal 1206 (at the start of the first UI) and terminates prior to an end of the first UI, and the trailing edge current pulse 1204 is initiated in the second UI and terminates prior to the trailing edge of the 1206 (i.e., prior to the end of the second UI). The trailing edge current pulse 1204 is shorter than the leading edge current pulse 1202. In a three UI pulse, the trailing edge pulse generation circuit 910a generates a second trailing edge current pulse that is initiated and terminated in the third UI. The second trailing edge current pulse is shorter than the leading edge current pulse 1202.

Figure 13:
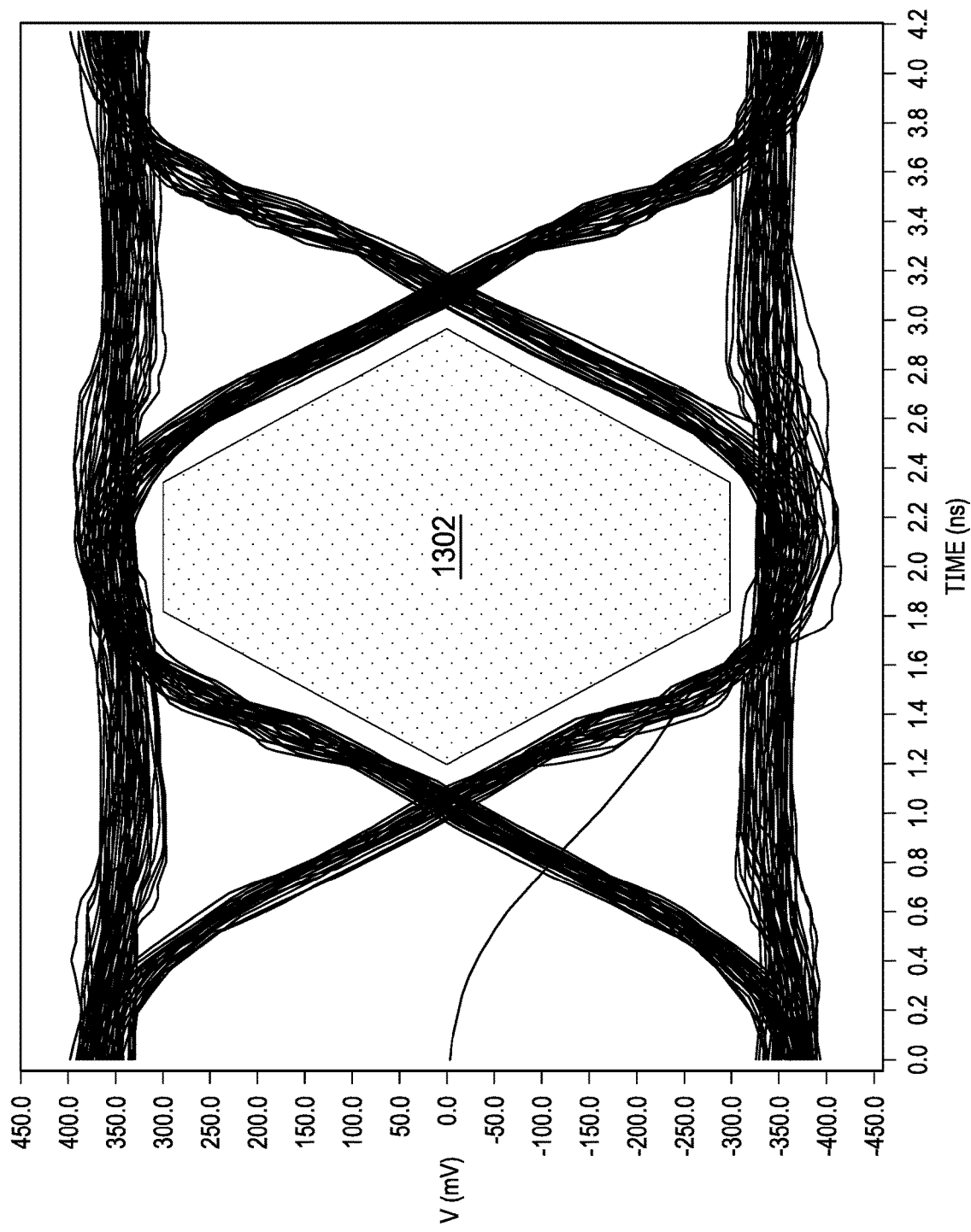
FIG. 13 shows an eye diagram for a 2 UI serial bus signal with trailing edge boost.

FIG. 13 shows an eye diagram for a serial bus signal with trailing edge boost, such as the serial bus signal 1206 of FIG. 12. The eye parameters specified by the USB 2.0 specification are illustrated as hexagon 1302. FIG. 13 shows that use of trailing edge boost produces an eye diagram that is compliant with the USB 2.0 specification.

The timing of the trailing edge pulse signal 1146 is based on the delay provided by the delay cells 1124-1130 of the pulse shortening circuit 1102. The delay provided by each delay cell varies with process, temperature, and voltage. A synchronization field precedes each USB packet to facilitate receiver synchronization. The synchronization field includes at least twelve single UI pulses. Trailing edge boost is not applied to single UI pulses. The delay calibration circuit 912 adjusts the delay applied in delay cells based on the single UI pulses of the synchronization field preceding each packet.

Figure 14:
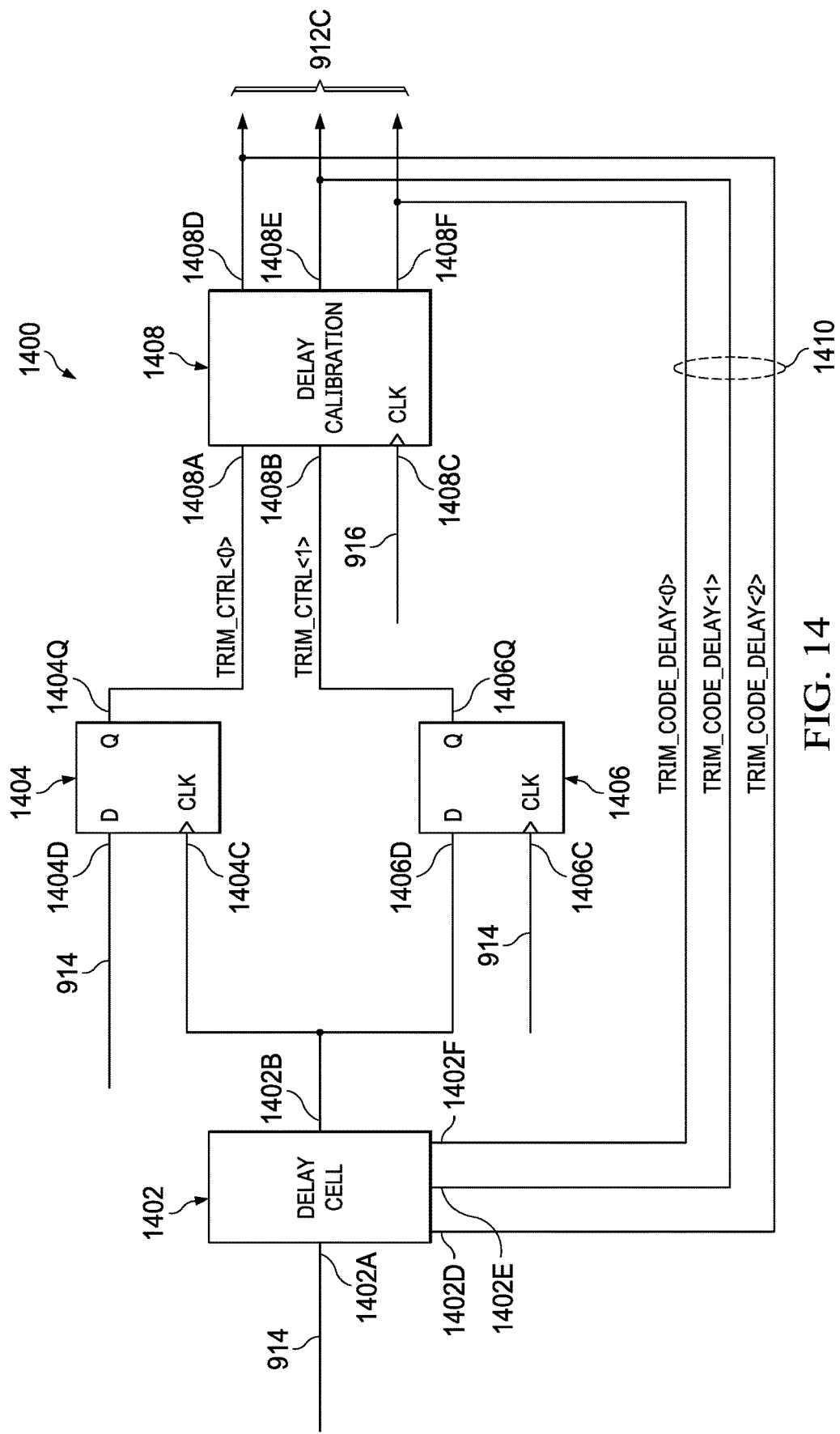
FIG. 14 shows a block diagram for a delay calibration circuit for adjusting the delay provided by delay cells of a trailing edge boost circuit.

The FIG. 14 shows a block diagram for a delay calibration circuit 1400 for adjusting the delay provided by delay cells of the trailing edge boost circuit 1100. The delay calibration circuit 1400 is an implementation of the delay calibration circuit 912. The delay calibration circuit 1400 includes a delay cell 1402, a flip-flop 1404, a flip-flop 1406, and a counter 1408. The delay cell 1402 is an instance of the delay cells 1124, 1126, 1128, or 1130 of the trailing edge boost circuit 1100. The delay cell 1402 delays the leading edge boost pulse signal 914. The delay of the delay cell 1402, and the delay of the delay cells 1124-1130, 1108-1110 and 1116-1118 is adjustable based on an input value provided at the calibration input terminals 1402D, 1402E, and 1402F. The delay cell 1402 includes a signal input terminal 1402A coupled to the leading edge boost pulse output terminal 908B of the leading edge boost pulse generation circuit 908.

The flip-flop 1404 applies the output of the delay cell 1402 to clock the leading edge boost pulse signal 914, and the flip-flop 1406 applies the leading edge boost pulse signal 914 to clock the output of the delay cell 1402. The flip-flop 1404 includes a data input terminal 1404D coupled to the leading edge boost pulse output terminal 908B of the leading edge boost pulse generation circuit 908, and a clock input terminal 1404C coupled to the output terminal 1402B of the delay cell 1402. The flip-flop 1406 includes a data input terminal 1406D coupled to the output terminal 1402B of the delay cell 1402, and a clock input terminal 1406C coupled to the leading edge boost pulse output terminal 908B of the leading edge boost pulse generation circuit 908.

The counter 1408 is incremented or decremented, based on the outputs of the flip-flop 1404 and the flip-flop 1406, to adjust the delay of the delay cell 1402. For example, if output of the flip-flop 1406 is logic "1" and output of the flip-flop 1404 is logic "0," then the counter 1408 is incremented to increase delay. If output of the flip-flop 1406 is logic "0" and output of the flip-flop 1404 is logic "1," then the counter 1408 is decremented to decrease delay. The counter 1408 includes logic circuitry that senses whether the output of the flip-flops 1404 and 1406 has changed from 1 and 0 to 0 and 1 respectively (or vice versa). On detection of such a change in the output of the flip-flops 1404 and 1406, the counter 1048 stops counting and the output of the counter 1408 is locked. The counter 1408 includes an input terminal 1408A coupled to an output terminal 1404Q of the flip-flop 1404, an input terminal 1408B coupled to an output 1406Q of the flip-flop 1406, and a clock input terminal 1408C coupled to the leading edge boost pulse output terminal 908B of the leading edge boost pulse generation circuit 908. The counter 1408 includes output terminals 1408D, 1408E, and 1408F that provide the trim delay code 1410. The output terminals 1408D, 1408E, and 1408F of the counter 1408 are coupled to the calibration input terminals 1402D, 1402E, and 1402F of the delay cell 1402, and to the output terminal 912C. The calibration input terminals of the delay cell 1124, the delay cell 1126, the delay cell 1128, the delay cell 1130, the delay cell 1108, the delay cell 1110, the delay cell 1116, the delay cell 1118, and other delay cells of the trailing edge boost circuit 1100. For example, the calibration input terminal 1126C of the delay cell 1126 and the calibration input terminal 1128C of the delay cell 1128 are coupled to the output terminals 1408D, 1408E, and 1408F of the counter 1408.

Figure 15:
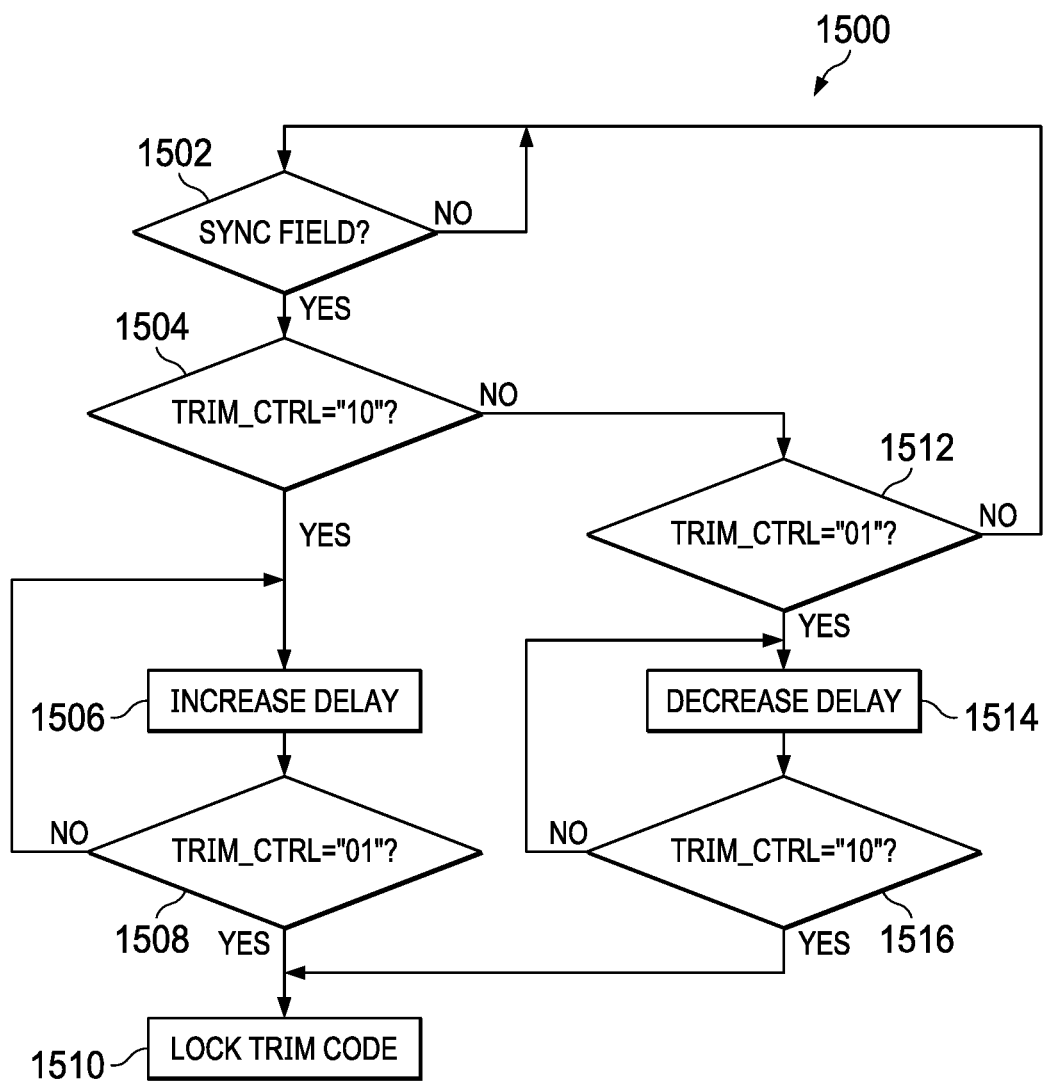
FIG. 15 shows a flow diagram for a method for adjusting delay in a trailing edge boost circuit.

FIG. 15 shows a flow diagram for a method 1500 for adjusting delay in a trailing edge boost circuit. Though depicted sequentially as a matter of convenience, at least some of the actions shown can be performed in a different order and/or performed in parallel. Additionally, some implementations may perform only some of the actions shown. Operations of the method 1500 are performed by an implementation of the delay calibration circuit 1400.

In block 1502, if a synchronization field is not being received by the serial bus re-driver circuit 900, then the delay provided by the delay cells of the serial bus re-driver circuit 900 is unchanged and the serial bus re-driver circuit 900 awaits reception of a synchronization field.

If, in block 1502, a synchronization field is being received by the serial bus re-driver circuit 900, then delay is adjusted based on the value of TRIM CTRL (the outputs of the flip-flops 1404 and 1406).

In block 1504, if the output of the flip-flop 1406 is logic "1" and the output of the flip-flop 1404 is logic "0" (the TRIM CTRL is "10") then the counter 1408 is incremented in block 1506 to increase delay at an edge of the leading edge boost pulse signal 914.

In block 1508, if the output of the flip-flop 1406 is logic "0" and the output of the flip-flop 1404 is logic "1" (the TRIM CTRL is "01") then the counter 1408 is disabled and the TRIM CODE produced by the counter 1408 is locked in block 1510. If the output of the flip-flop 1406 is not logic "0" or the output of the flip-flop 1404 is not logic "1" (the TRIM CTRL is not "01") then the counter 1408 is incremented in block 1506.

If, in block 1504, the output of the flip-flop 1406 is not logic "0" or the output of the flip-flop 1404 is not logic "1" (the TRIM CTRL is not "10"), then, in block 1512, if the output of the flip-flop 1406 is logic "0" and the output of the flip-flop 1404 is logic "1" (the TRIM CTRL is "01") then the counter 1408 is decremented to decrease delay in block 1514 at an edge of the leading edge boost pulse signal 914.

In block 1516, if the output of the flip-flop 1406 is logic "1" and the output of the flip-flop 1404 is logic "0" (the TRIM CTRL is "10") then the counter 1408 is disabled and the TRIM CODE produced by the counter 1408 is locked in block 1510. If the output of the flip-flop 1406 is not logic "1" or the output of the flip-flop 1404 is not logic "0" (the TRIM CTRL is not "10") then the counter 1408 is decremented in block 1514.

After the TRIM CODE is locked in block 1510, the method 1500 continues in block 1502 awaiting a reception of a synchronization field.

Figure 16:
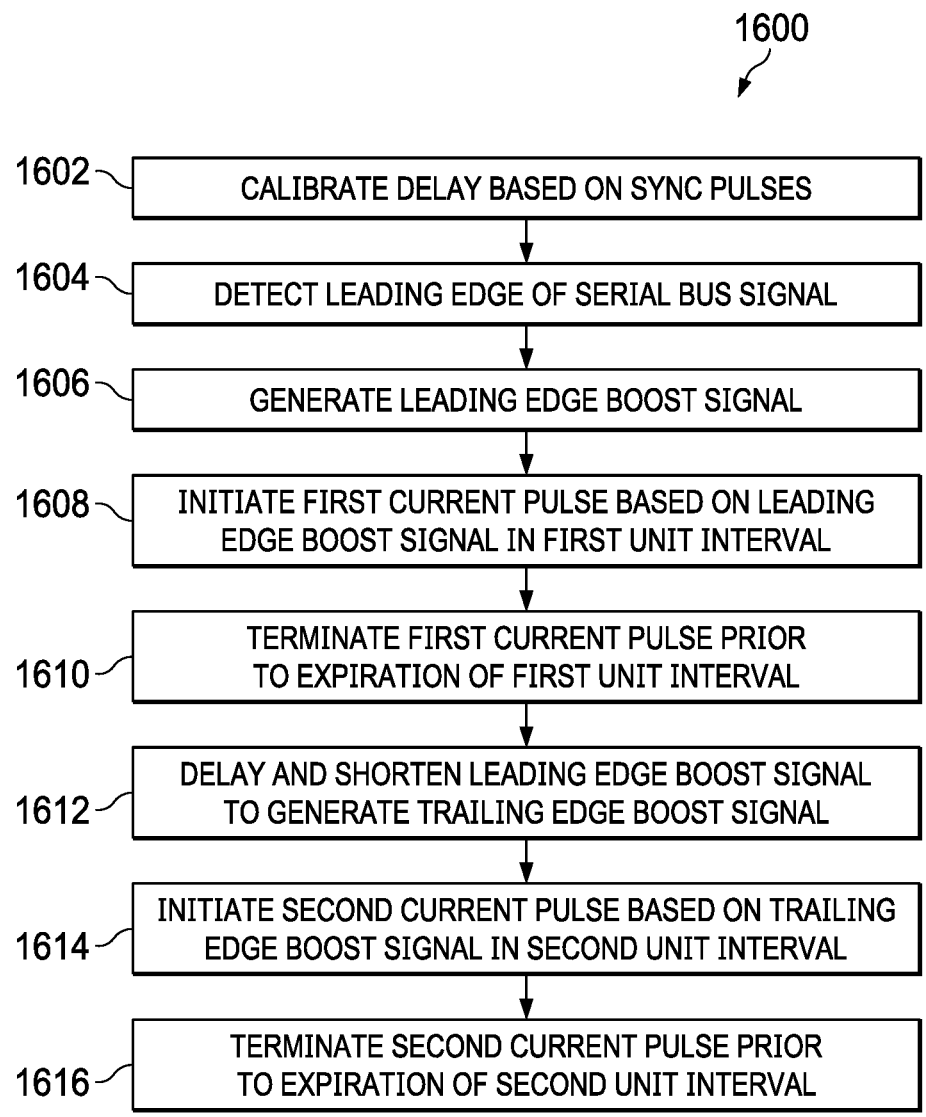
FIG. 16 shows a flow diagram for a method for re-driving a serial bus signal using trailing edge boost.

FIG. 16 shows a flow diagram for a method 1600 for re-driving a serial bus signal using trailing edge boost. Though depicted sequentially as a matter of convenience, at least some of the actions shown can be performed in a different order and/or performed in parallel. Additionally, some implementations may perform only some of the actions shown. Operations of the method 1600 are performed by an implementation of the serial bus re-driver circuit 900.

In block 1602, the delay cells of the trailing edge boost circuit 1100 are trimmed to adjust the delays provided by the delay cells. The trim is based on the synchronization field preceding each packet as per the method 1500.

In block 1604, the edge detector circuit 902 detects a leading edge of the serial bus signal. For example, a comparator of the edge detector circuit 902 detects voltage of the serial bus signal above a threshold.

In block 1606, the booster circuit 904 generates a leading edge boost pulse signal 914 responsive to the detection of the leading edge of the serial bus signal. The leading edge boost pulse signal 914 is about 0.7 UI in duration in some implementations.

In block 1608, the booster circuit 904 initiates a current pulse on the serial bus in a first UI of the serial bus signal. The current pulse is based on the leading edge boost pulse signal 914.

In block 1610, the current pulse initiated in block 1608 is terminated prior to expiration of the first UI.

In block 1612, the leading edge boost pulse signal 914 is delayed and shortened in the trailing edge boost circuit 1100 to generate a trailing edge pulse signal 1146.

In block 1614, the trailing edge boost circuit 1100 initiates a current pulse on the serial bus in a second UI of the serial bus signal. The current pulse is based on the trailing edge pulse signal 1146.

In block 1616, the current pulse initiated in block 1614 is terminated prior to expiration of the second UI.

Implementations of the method 1600 produce additional trailing edge boost signals in third, fourth, or other UIs by delaying the trailing edge pulse signal 1146, and produce additional current pulses based on the additional trailing edge boost signals. For example, an implementation of the method generates a second trailing edge boost signal, based on the trailing edge boost signal 1146, in a third UI, initiates a current pulse in the third UI responsive to the second trailing edge boost signal, and terminates the current pulse prior to the expiration of the third UI.

Figure 17:
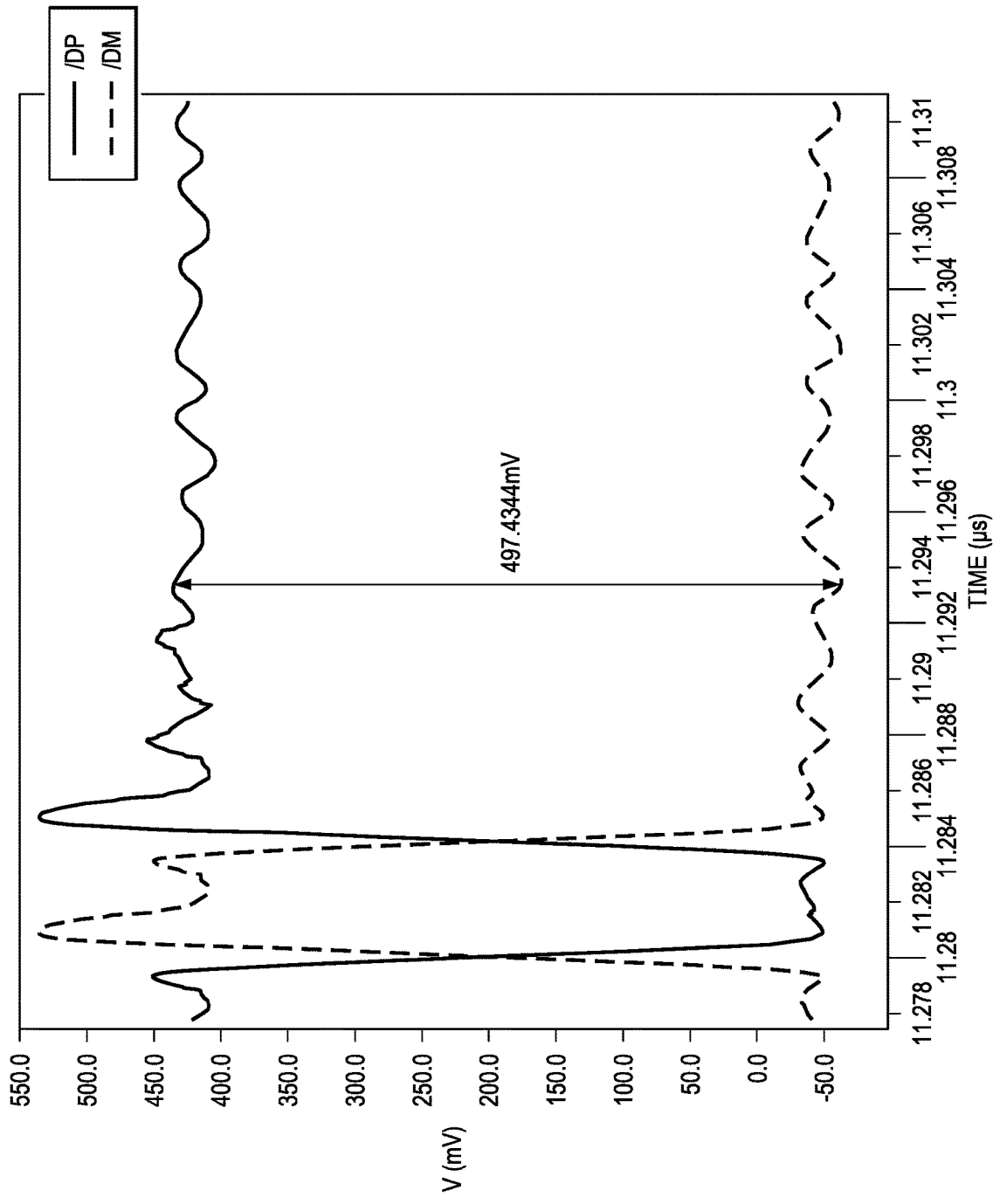
FIG. 17 shows differential swing in a serial bus system with a re-driver circuit that includes trailing edge boost.

FIG. 17 shows differential swing in a serial bus system that includes the serial bus re-driver circuit 900 to provide trailing edge boost. Because the serial bus re-driver circuit 900 does not provide level boost current, the differential voltage of the serial bus signal (498 mv in FIG. 17) does not exceed 525 mv and the host 102 does not mistakenly detect disconnection of the device 106 from the serial bus. Thus, the serial bus re-driver circuit 900 prevents communication disruption caused by erroneous disconnection detection.

Figure 18A:
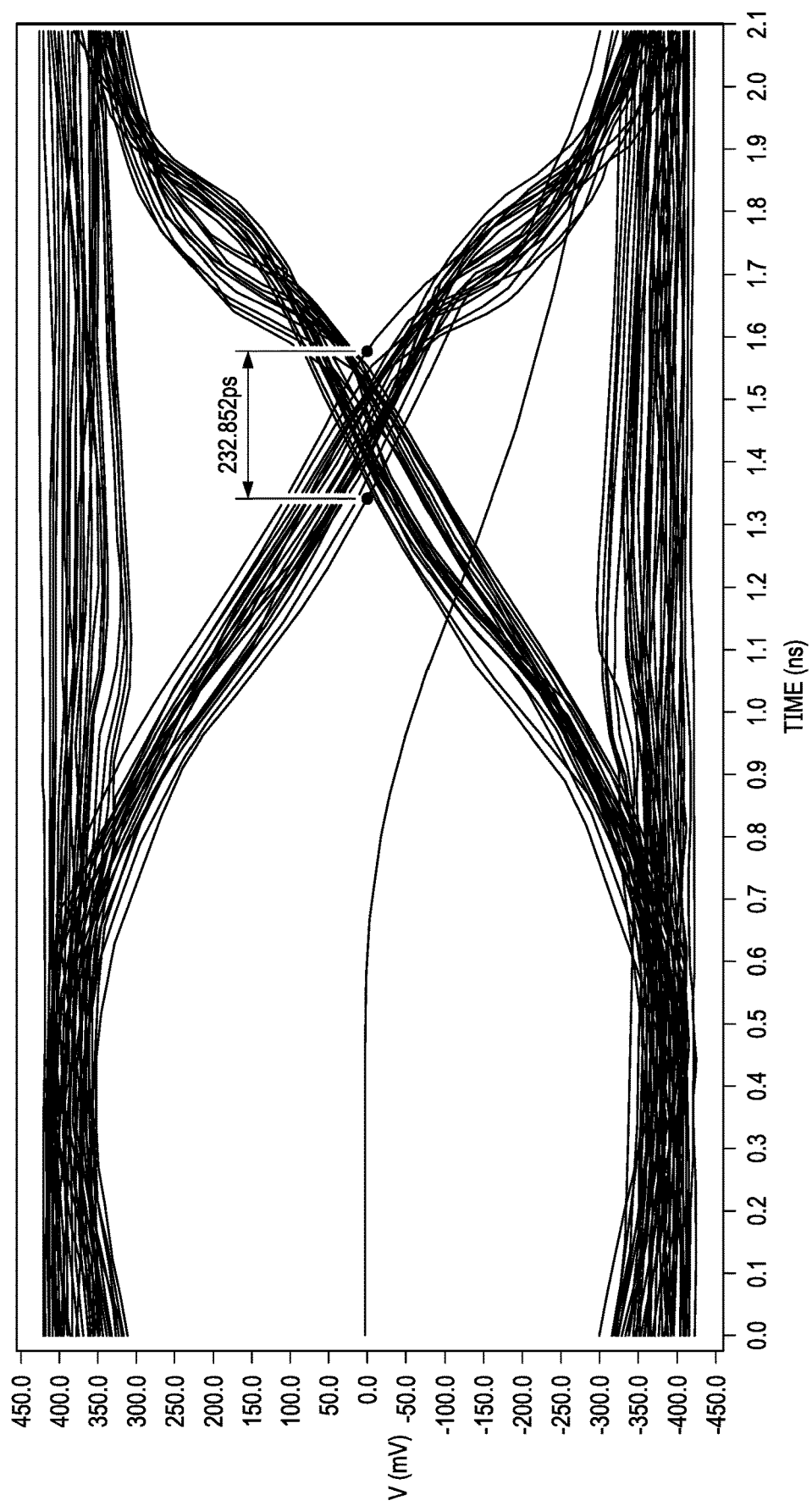
FIGS. 18A and 18B show jitter in a serial bus system with a re-driver circuit that includes level boost and in a re-driver circuit that includes trailing edge boost.
Figure 18B:
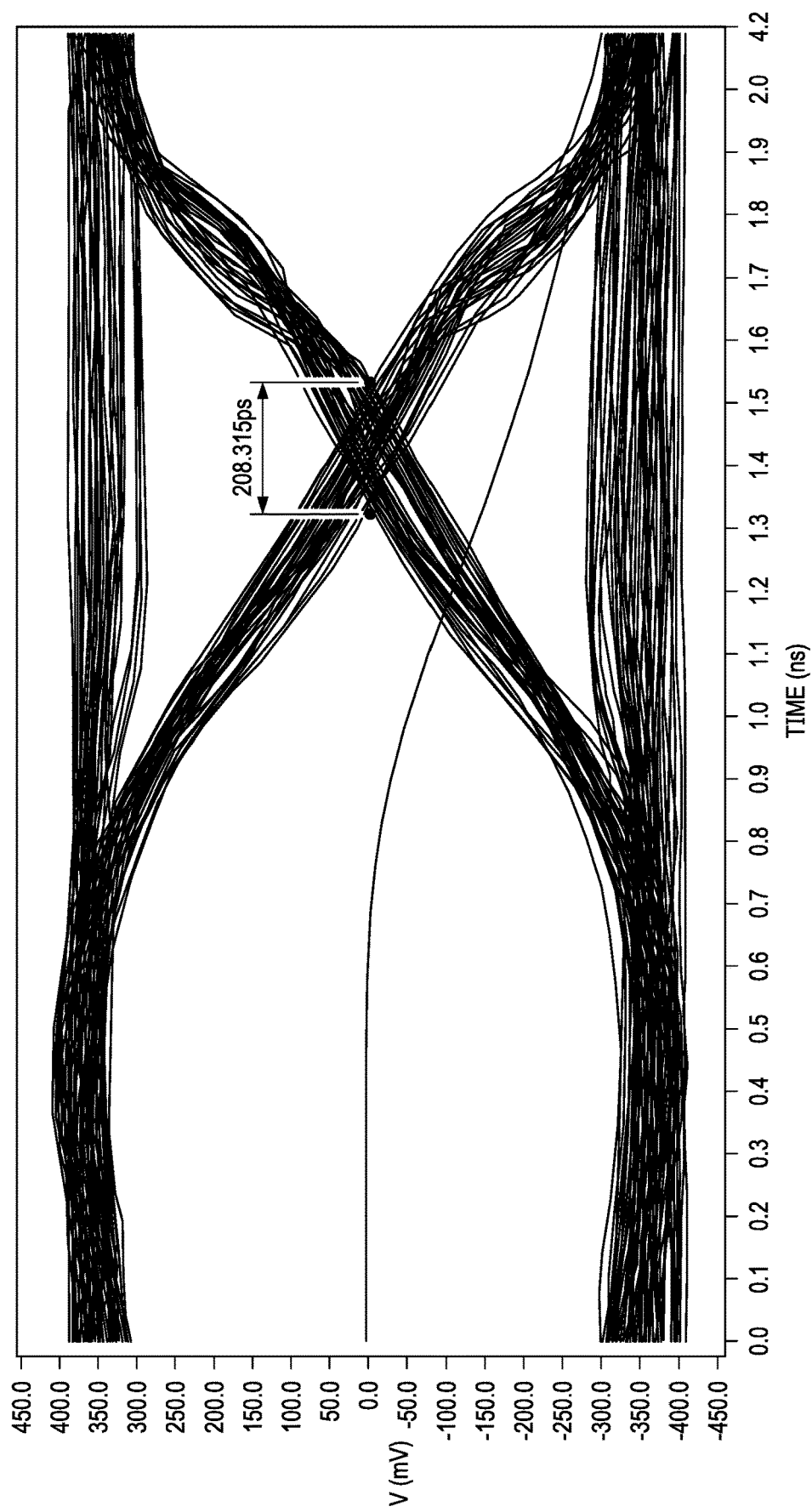

FIGS. 18A and 18B show jitter in serial bus signals with and without trailing edge boost. FIG. 18A shows a serial bus signal with high level boost current (e.g., 1.7 ma) applied. The serial bus signal of the FIG. 18A includes about 233 ps of jitter. FIG. 18B shows a serial bus signal with trailing edge boost applied (without high level boost current). In FIG. 18B, the jitter in the serial bus signal has been reduced to about 208 ps because the edge timing is not affected by level boost current. Thus, the application of trailing edge boost reduces the jitter present in the serial bus signal.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A serial bus re-driver circuit, comprising:
   a serial bus terminal;
   an edge detector circuit comprising:
      an input terminal coupled to the serial bus terminal; and
      an output terminal; and
   a booster circuit coupled to the edge detector circuit, and comprising:
      a leading edge boost pulse generation circuit comprising:
         an input terminal coupled to the output terminal of the edge detector circuit; and
         a leading edge boost pulse output terminal;
      a trailing edge boost pulse generation circuit coupled to the leading edge boost generation circuit, and comprising:
         a pulse shortening circuit coupled to the leading edge boost pulse output terminal;
         a pulse gating circuit coupled to the pulse shortening circuit; and
         a drive transistor coupled to the pulse gating circuit and the serial bus terminal;
      wherein the pulse shortening circuit comprises:
   a first delay cell comprising:
      an input terminal coupled to the leading edge boost pulse output terminal; and
      an output terminal;
   a second delay cell comprising:
      an input terminal coupled to the output terminal of the first delay cell; and
      an output terminal;
   a conjunctive logic circuit comprising:
      a first input terminal coupled to the output terminal of the first delay cell;
      a second input terminal coupled to the output terminal of the second delay cell; and
      an output terminal coupled to the drive transistor.

2. The serial bus re-driver circuit of claim 1, wherein the pulse shortening circuit comprises:
   a third delay cell comprising:
      an input terminal coupled to the output terminal of the second delay cell; and
      an output terminal coupled to a third input terminal of the conjunctive logic circuit.

3. The serial bus re-driver circuit of claim 1, wherein the pulse gating circuit comprises:
   a first logic gate comprising:
      a first input terminal coupled to the output terminal of the edge detector circuit;
      a second input terminal coupled to the output terminal of the conjunctive logic circuit; and
      an output terminal; and
   a second logic gate comprising:
      a first input terminal coupled to the output terminal of the first logic gate;
      a second input terminal coupled to the leading edge boost pulse output terminal; and
      an output terminal coupled to the drive transistor.

4. The serial bus re-driver circuit of claim 1, wherein:
   the pulse gating circuit is a first pulse gating circuit;
   the drive transistor is a first drive transistor; and
   the serial bus re-driver circuit further comprises:
      a second drive transistor;
      a third delay cell comprising:
         an input terminal coupled to the output terminal of the conjunctive logic circuit; and
         an output terminal;
      a second pulse gating circuit comprising:
         a first logic gate comprising:
            a first input terminal coupled to the output terminal of the edge detector circuit;
            a second input terminal coupled to the output terminal of the third delay cell; and
            an output terminal; and
         a second logic gate comprising:
            a first input terminal coupled to the output terminal of the first logic gate;
            a second input terminal coupled to the leading edge boost pulse output terminal; and
            an output terminal coupled to the second drive transistor.

5. The serial bus re-driver circuit of claim 4, wherein:
   the first delay cell comprises a calibration input terminal;
   the second delay cell comprises a calibration input terminal; and
   the output terminal of the counter is coupled to the calibration input terminal of the first delay cell and the calibration input terminal of the second delay cell.

6. The serial bus re-driver circuit of claim 1, further comprising:
   a delay calibration circuit coupled to the first delay cell and the second delay cell, and comprising:
      a third delay cell comprising:
         a signal input terminal coupled to the leading edge boost pulse output terminal;
         a calibration input terminal; and
         an output terminal;
      a first flip-flop comprising:
         a data input terminal coupled to the leading edge boost pulse output terminal;
         a clock input terminal coupled to the output terminal of the third delay cell; and
         an output terminal;
      a second flip-flop comprising:
         a data input terminal coupled to the output terminal of the third delay cell;

a clock input terminal coupled to the leading edge boost pulse output terminal; and
an output terminal;
a counter comprising:
a first input terminal coupled to the output of the first flip-flop;
a second input terminal coupled to the output of the second flip-flop;
a clock input terminal coupled to the output terminal of the edge detector circuit; and
an output terminal coupled to the calibration input terminal of the third delay cell.

7. A serial bus re-driver circuit, comprising:
an edge detector circuit configured to detect a transition of a serial bus signal;
a booster circuit coupled to the edge detector circuit, and configured to switch current to the serial bus signal, the booster circuit comprising:
a leading edge boost pulse generation circuit configured to switch a first current pulse to the serial bus signal at the transition of the serial bus signal;
a trailing edge boost pulse generation circuit configured to switch a second current pulse to the serial bus signal;
wherein the second current pulse is shorter than the first current pulse;
wherein:
leading edge boost pulse generation circuit is configured to generate a leading edge boost signal that controls the first current pulse;
the trailing edge booster circuit is configured to generate, based on the leading edge boost signal, a trailing edge boost control signal (1146) that controls the second current pulse.

8. The serial bus re-driver circuit of claim 7, wherein the trailing edge booster circuit is configured to delay and shorten the leading edge boost signal to generate the trailing edge boost control signal.

9. The serial bus re-driver circuit of claim 7, wherein:
the trailing edge booster circuit comprises a delay cell configured to delay the leading edge boost signal; and
the trailing edge booster circuit further comprises a delay calibration circuit configured to adjust delay provided by the delay cell based on timing of synchronization pulses provided in the serial bus signal.

10. The serial bus re-driver circuit of claim 9, wherein the delay calibration circuit comprises a delay calibration counter (1408) configured to set the delay provided by the delay cell, and the delay calibration circuit is configured to increment or decrement the delay calibration counter based on a relationship of the leading edge boost signal and the leading edge boost signal delayed by the delay cell.

* * * * *